(12) United States Patent
Hwang et al.

(10) Patent No.: US 12,200,969 B2
(45) Date of Patent: Jan. 14, 2025

(54) DISPLAY DEVICE

(71) Applicant: SAMSUNG DISPLAY CO., LTD., Yongin-Si (KR)

(72) Inventors: Sejachul Hwang, Suwon-si (KR); Do Youb Kim, Suwon-si (KR); Dong Wook Choi, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 548 days.

(21) Appl. No.: 17/310,324

(22) PCT Filed: Nov. 18, 2019

(86) PCT No.: PCT/KR2019/015753
§ 371 (c)(1),
(2) Date: Jul. 27, 2021

(87) PCT Pub. No.: WO2020/159045
PCT Pub. Date: Aug. 6, 2020

(65) Prior Publication Data
US 2022/0077419 A1  Mar. 10, 2022

(30) Foreign Application Priority Data

Jan. 29, 2019  (KR) .................. 10-2019-0011011

(51) Int. Cl.
*H10K 50/87* (2023.01)
*H05K 1/18* (2006.01)
(Continued)

(52) U.S. Cl.
CPC ............ *H10K 50/87* (2023.02); *H05K 1/189* (2013.01); *H10K 50/8426* (2023.02);
(Continued)

(58) Field of Classification Search
CPC ............... H10K 50/87; H10K 50/8426; H10K 50/865; H10K 59/1213; H10K 59/131;
(Continued)

(56) References Cited

U.S. PATENT DOCUMENTS 10,032,408 B2  7/2018  Kang et al.
2005/0280373 A1  12/2005  Chang
(Continued)

FOREIGN PATENT DOCUMENTS

CN  1832223 A  9/2006
CN  1901221 A  1/2007
(Continued)

OTHER PUBLICATIONS

International Search Report of PCT/KR2019/015753, Mar. 2, 2020, 4 pages.
Chinese Notification of the First Office Action, for Patent Application No. 201980090273.0, mailed Mar. 25, 2024, 8 pages.

*Primary Examiner* — Douglas W Owens
(74) *Attorney, Agent, or Firm* — Lewis Roca Rothgerber Christie LLP

(57) ABSTRACT

A display device includes: a display panel including sub-pixels and a heat dissipation pad electrically connected to at least one of the sub-pixels; a heat dissipation sheet on the heat dissipation pad; and an insulating heat dissipation adhesive layer between the heat dissipation sheet and the heat dissipation pad to adhere the heat dissipation sheet and the heat dissipation pad.

22 Claims, 25 Drawing Sheets

(51) Int. Cl.
*H10K 50/842* (2023.01)
*H10K 50/86* (2023.01)
*H10K 59/121* (2023.01)
*H10K 59/131* (2023.01)
*H10K 59/40* (2023.01)

(52) U.S. Cl.
CPC ....... *H10K 50/865* (2023.02); *H10K 59/1213* (2023.02); *H10K 59/131* (2023.02); *H10K 59/40* (2023.02)

(58) Field of Classification Search
CPC ...... H10K 59/40; H10K 59/87; H10K 50/305; H05K 1/189
See application file for complete search history.

(56) References Cited

U.S. PATENT DOCUMENTS

| | | | |
|---|---|---|---|
| 2006/0256047 A1 | 11/2006 | Kimura et al. | |
| 2007/0045616 A1 | 3/2007 | Tokuda et al. | |
| 2007/0159078 A1 | 7/2007 | Park et al. | |
| 2007/0216273 A1 | 9/2007 | Yanagawa et al. | |
| 2009/0267526 A1 | 10/2009 | Sung et al. | |
| 2010/0244005 A1 | 9/2010 | Gyoda | |
| 2014/0145164 A1 | 5/2014 | Odaka et al. | |
| 2016/0027718 A1* | 1/2016 | Park | H10K 50/87 165/80.3 |
| 2017/0124939 A1 | 5/2017 | Kang et al. | |
| 2018/0366679 A1* | 12/2018 | Kim | B32B 27/10 |

FOREIGN PATENT DOCUMENTS

| | | |
|---|---|---|
| JP | 11-101989 A | 4/1999 |
| JP | 2006-235093 A | 9/2006 |
| JP | 2006-236999 A | 9/2006 |
| JP | 2007-26970 A | 2/2007 |
| JP | 2008-103359 A | 5/2008 |
| JP | 2008-165029 A | 7/2008 |
| JP | 2014-49441 A | 3/2014 |
| JP | 2018-155876 A | 10/2018 |
| KR | 10-2005-0106285 A | 11/2005 |
| KR | 10-0716874 B1 | 5/2007 |
| KR | 10-2007-0091446 A | 9/2007 |
| KR | 10-2008-0076521 A | 8/2008 |
| KR | 10-2010-0108267 A | 10/2010 |
| KR | 10-2011-0039794 A | 4/2011 |
| KR | 10-2011-0127035 A | 11/2011 |
| KR | 10-2014-0079093 A | 6/2014 |
| KR | 10-1695317 B1 | 1/2017 |
| KR | 10-2017-0049780 A | 5/2017 |

\* cited by examiner

DT: DT_ACT, DT_G, DT_S, DT_D
ST1: ACT1, G1, S1, D1
ST2: ACT2, G2, S2, D2
ST3: ACT3, G3, S3, D3
ST4: ACT4, G4, S4, D4
ST5: ACT5, G5, S5, D5
ST6: ACT6, G6, S6, D6
C1: CE1, CE2

GTL1: G1, DT_G1, G6
CTL2: CE2
DTL: DL, DT_G2, ANDE

DISPLAY DEVICE

CROSS-REFERENCE TO RELATED APPLICATIONS

This application is a U.S. National Phase Patent Application of International Patent Application Number PCT/KR2019/015753, filed on Nov. 18, 2019, which claims priority to Korean Patent Application Number 10-2019-0011011, filed on Jan. 29, 2019, the entire content of all of which is incorporated herein by reference.

BACKGROUND

1. Field

Aspects of embodiments of the present disclosure relate to a display device.

2. Description of the Related Art

Recently, display devices have been developed as thin film display devices, such as a liquid crystal display (LCD) device and an organic light emitting display (OLED) device. Such display devices may be applied to a smartphone, a tablet personal computer (PC), a digital camera, a laptop computer, a navigation system, and a television (TV). In addition, such display devices may be applied to an instrument panel, a center fascia, or a center information display (CID) disposed on a dashboard in an automobile.

In midsummer, a temperature inside an automobile can reach 80 to 90° C. Accordingly, when the display device applied to the automobile is driven at the temperature of 80 to 90° C., an internal temperature of the display device rises even higher. Accordingly, the characteristics of the display device can be deteriorated or a lifespan of the display device can be reduced.

SUMMARY

Aspects of embodiments of the present disclosure are directed to providing a display device having increased heat dissipation.

Aspects and features of the present disclosure are not limited to that mentioned above, and other aspects and features may be apparently understood from the following description by those skilled in the art.

According to an embodiment, a display device includes: a display panel including sub-pixels and a heat dissipation pad electrically connected to at least one of the sub-pixels; a heat dissipation sheet on the heat dissipation pad; and an insulating heat dissipation adhesive layer between the heat dissipation sheet and the heat dissipation pad to adhere the heat dissipation sheet and the heat dissipation pad.

The display panel may further include a conductive line configured to electrically connect the at least one of the sub-pixels and the heat dissipation pad.

The display panel may further include a second power voltage line to which a second power voltage is applied, and the conductive line may cross the second power voltage line.

The display panel may further include a sealant extending around a display region where the sub-pixels are disposed, and the conductive line may cross the sealant.

The sealant may be at an outer side of the second power voltage line, and the heat dissipation pad may be at an outer side of the sealant.

Each of the sub-pixels may include a light emitting element and a driving transistor. The driving transistor may be configured to control currents flowing from a first power line, to which a first power voltage higher than the second power voltage is applied, to the light emitting element according to a data voltage applied to a gate electrode thereof.

The first power voltage may be applied to the conductive line, and the conductive line may be on the second power voltage line.

Each of the sub-pixels may further include an initialization transistor configured to initialize the gate electrode of the driving transistor to an initialization voltage.

The initialization voltage may be applied to the conductive line, and the conductive line may be on the second power voltage line.

Each of the sub-pixels may further include a scan transistor configured to supply the data voltage to the gate electrode of the driving transistor according to a scan signal.

The data voltage may be applied to the conductive line, and the conductive line may be on the second power voltage line.

The scan signal may be applied to the conductive line, and the conductive line may be on the same layer as the second power voltage line.

The conductive line may include a scan connection electrode on the second power voltage line.

Each of the sub-pixels may further include a light emission control transistor configured to block currents flowing from the first power line to the light emitting element through the driving transistor according to a light emission control signal.

The light emission control signal may be applied to the conductive line, and the conductive line may be on the same layer as the second power voltage line.

Each of the sub-pixels may further include a light blocking layer under an active layer of the driving transistor, and the conductive line may be connected to the light blocking layer.

The conductive line may be under the second power voltage line.

The display panel may further include a second power voltage line to which a second power voltage is applied; and the conductive line may be connected to the second power voltage line.

The display panel may include a first substrate and a second substrate on the first substrate, and the heat dissipation pad may be at one side of the first substrate that is not covered by the second substrate.

The heat dissipation sheet may be on a portion of an upper surface, one side surface, and a portion of a lower surface of the first substrate.

The display panel may further include display pads at another side of the first substrate that is not covered by the second substrate.

The display device may further include a flexible circuit board attached to the display pads of the display panel.

The insulating heat dissipation adhesive layer may be a thermally conductive silicon adhesive.

In a display device according to an embodiment, a conductive line electrically connected to sub-pixels can be connected to a heat dissipation pad formed in a non-display region of a display panel. Accordingly, heat generated in (or transferred to) the conductive line electrically connected to the sub-pixels can be dissipated through the heat dissipation pad, an insulating heat dissipation adhesive layer, and a heat dissipation sheet. Accordingly, deterioration of characteristics of the display device or a reduction of a lifespan of the display device due to an increase in internal temperature of the display device may be mitigated or avoided.

Aspects and features of the present disclosure are not limited to those mentioned above, and additional aspects and features are described herein.

DETAILED DESCRIPTION

Figure 1:
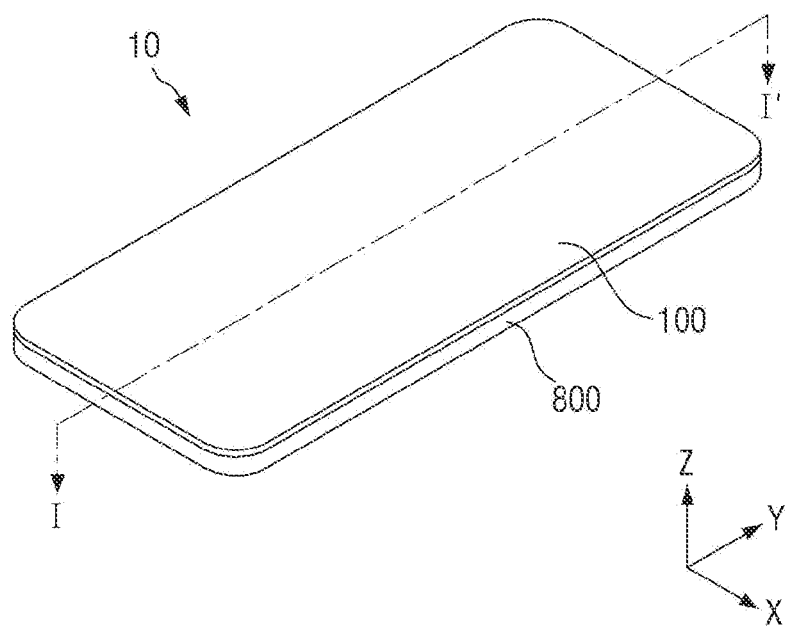
FIG. 1 is a perspective view illustrating a display device according to an embodiment.

Aspects and features of the present disclosure, and a method of achieving them, will become apparent with reference to the embodiments described below, in detail, together with the accompanying drawings. However, the present disclosure is not limited to the embodiments disclosed below and can be implemented in various forms different from each other. The embodiments described below make the present disclosure complete, in conjunction with common knowledge in the technical field to which the present disclosure pertains. That is to say, the embodiments described herein are provided to fully inform the scope of the present disclosure to those skilled in the art, and the disclosure is defined by the scope of the claims and their equivalents.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

The same reference numerals refer to the same elements throughout the specification. The shapes, sizes, ratios, angles, numbers, etc. disclosed in the drawings for describing the embodiments are examples, and the present disclosure is not limited to the illustrated matters.

Although the first, second, and the like are used to describe various elements, it goes without saying that these elements are not limited by these terms. These terms are only used to distinguish one component from another component. Therefore, a first component mentioned below may be a second component within the scope of the present disclosure.

The terminology used herein is for the purpose of describing particular example embodiments of the present disclosure and is not intended to be limiting of the described example embodiments of the present disclosure. As used herein, the singular forms "a" and "an" are intended to include the plural forms as well, unless the context clearly indicates otherwise. It will be further understood that the terms "includes," "including." "comprises," and/or "comprising," when used in this specification, specify the presence of stated features, integers, steps, operations, elements, and/or components but do not preclude the presence or addition of one or more other features, integers, steps, operations, elements, components, and/or groups thereof.

Each of the features of the various embodiments of the present disclosure can be partially or entirely combined with each other, technically various interlocking and driving are possible, and each of the embodiments may be independently implemented with respect to each other, or can be implemented together in an association relationship.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

Hereinafter, embodiments of the present disclosure will be described with reference to the accompanying drawings.

Figure 2:
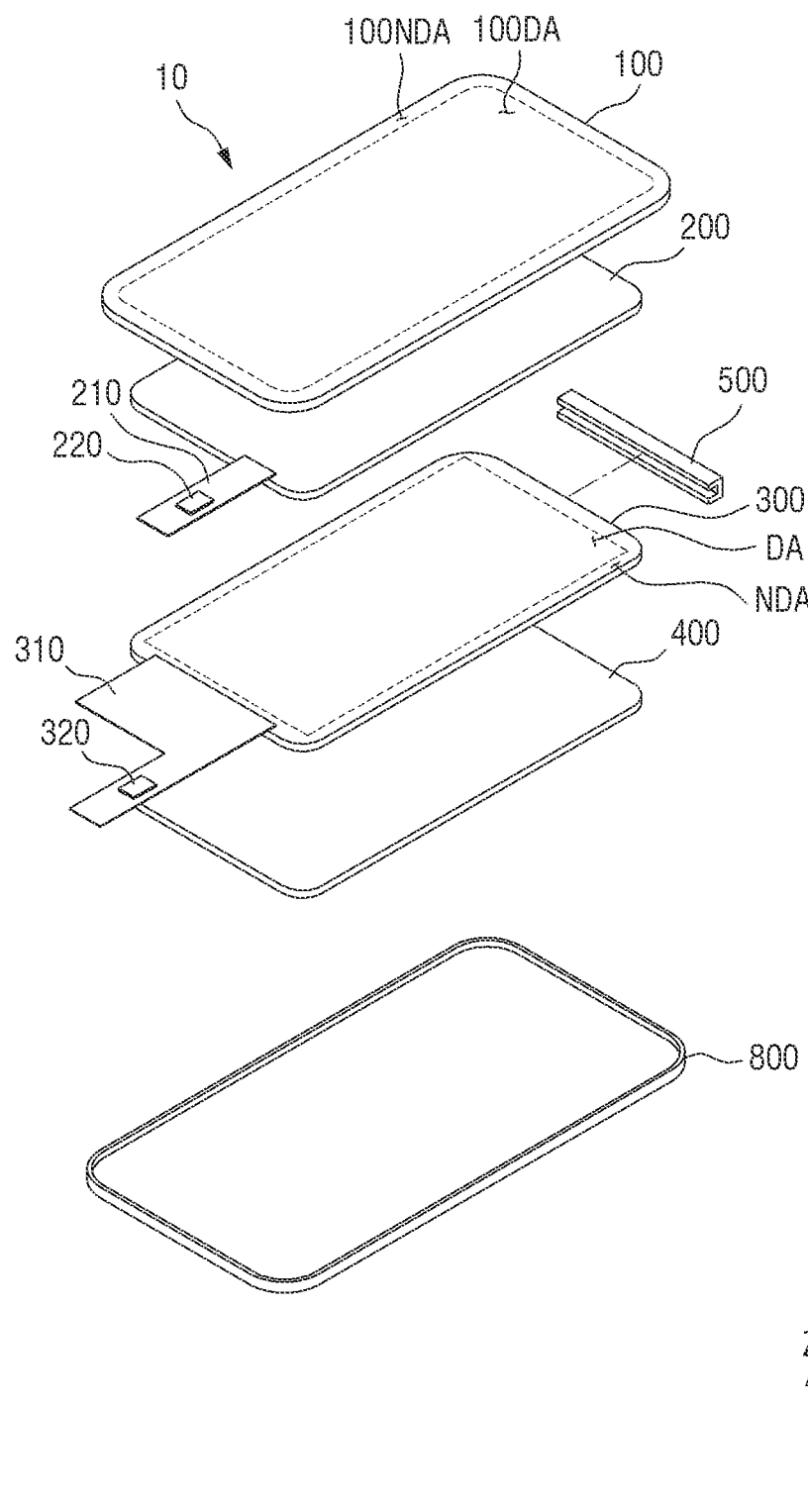
FIG. 2 is an exploded perspective view of the display device shown in FIG. 1.
Figure 3:
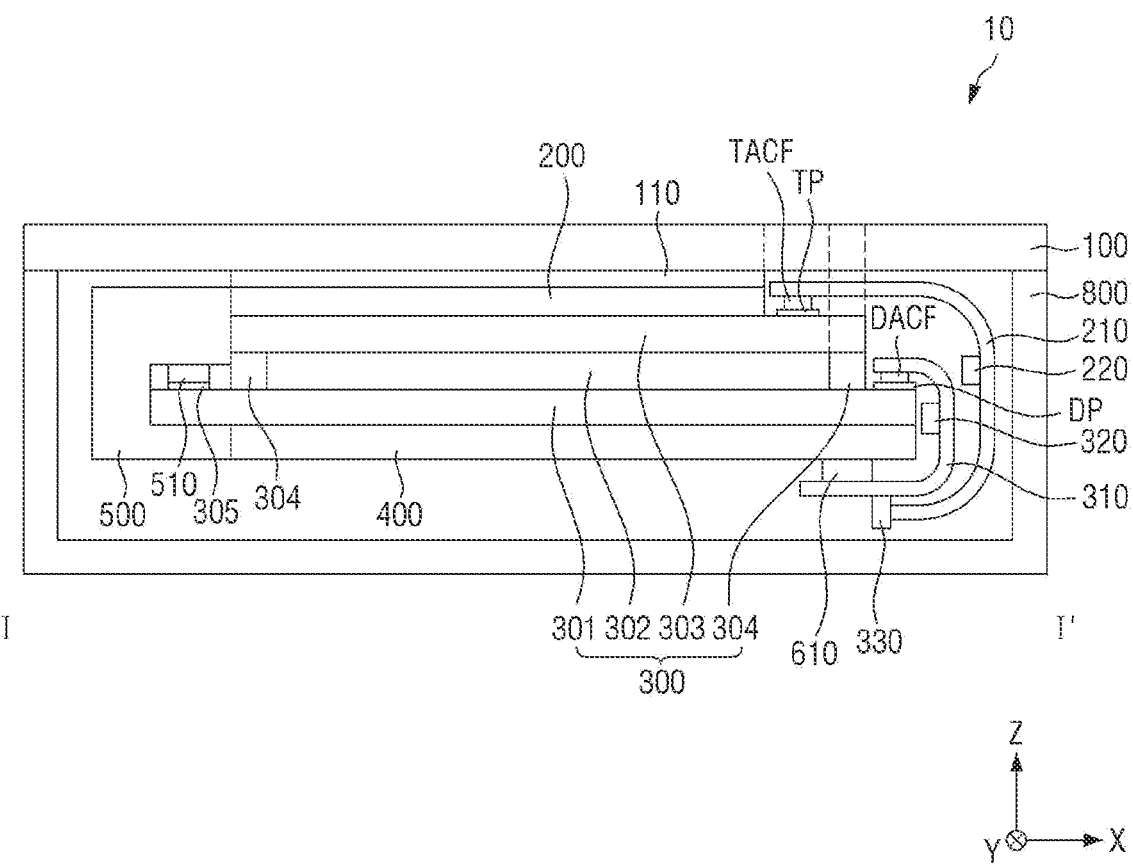
FIG. 3 is a cross-sectional view taken along the line I-I' in FIG. 1.

FIG. 1 is a perspective view illustrating a display device according to an embodiment, FIG. 2 is an exploded perspective view of the display devices shown in FIG. 1, and FIG. 3 is a cross-sectional view taken along the line I-I' in FIG. 1.

Referring to FIGS. 1 to 3, a display device 10 according to an embodiment includes a cover window 100, a touch sensing device 200, a touch circuit board 210, a display panel 300, a display circuit board 310, a panel lower member 400, a heat dissipation sheet 500, and a lower cover 800.

In the specification, "upper portion," "top," and "upper surface" indicate a direction in which the touch sensing device 200 is disposed with respect to the display panel 300, that is, the Z-axis direction in the drawings, and "lower portion," "bottom," and "lower surface" indicate a direction in which the lower cover 800 is disposed with respect to the display panel 300, that is, a direction opposite the Z-axis direction in the drawings. Further, "left," "right," "upper," and "lower" indicate directions when the display panel 300 is viewed in a plan view. For example, "left" indicates a direction opposite an X-axis direction in the drawings, "right" indicates the X-axis direction in the drawings, "upper" indicates a Y-axis direction in the drawings, and "lower" indicates a direction opposite the Y-axis direction in the drawings.

Further, the display device 10 may be any one of an organic light emitting display device, a liquid crystal display device, a plasma display device, a field emission display device, an electrophoretic display device, an electrowetting display device, a quantum dot light emitting display device, and a micro-LED display device. Hereinafter, the display device 10 is described as an organic light emitting display device, but the present disclosure is not limited thereto.

The display device 10 may have a rectangular shape in a plan view. For example, as shown in FIG. 1, the display device 10 may have a rectangular planar shape having short sides in a first direction (e.g., the X-axis direction in the drawings) and long sides in a second direction (e.g., the Z-axis direction in the drawings). Each corner where the short sides in the first direction (X-axis direction) and the long sides in the second direction (Z-axis direction) meet may be rounded to have a curvature (e.g., a predetermined curvature) as shown in FIG. 1 or may be formed at a right angle. The planar shape of the display device 10 is not limited to the rectangular shape, and the display device 10 may be formed in other polygonal shapes, a circular shape, or an oval shape.

The cover window 100 may be disposed on the display panel 300 to cover an upper surface of the display panel 300. Accordingly, the cover window 100 may protect the upper surface of the display panel 300. The cover window 100 may be attached to the touch sensing device 200 through an adhesive layer 110 as shown in FIG. 3. The adhesive layer 110 may be an optically clear adhesive film (OCA) or an optically clear resin (OCR).

The cover window 100 may have a transmissive part for displaying an image of the display panel 300 and a light blocking part corresponding to a region other than the transmissive part. The light blocking part of the cover window 100 may be formed to be opaque so that unnecessary components, other than an image of the display panel 300, are not visually recognized by a user. In some embodiments, the light blocking part of the cover window 100 may be formed as a decorative layer on which a pattern, which may be visible to the user when the image is not displayed, is formed. For example, a logo of a company or various characters may be patterned on the light blocking part of the cover window 100.

The cover window 100 may include (or may be made of) glass, sapphire, and/or plastic. The cover window 100 may be formed to be rigid or flexible.

The touch sensing device 200 may be disposed between the cover window 100 and the display panel 300. The touch sensing device 200 is a device for sensing a user's touch position and may be implemented in a capacitive method, such as a self-capacitance method or a mutual capacitance method, or in an infrared method.

As shown in FIG. 3, the touch sensing device 200 may be disposed on an upper substrate (e.g., a second substrate 303) of the display panel 300. In some embodiments, the touch sensing device 200 may be integrally formed with the display panel 300. In such an embodiment, the upper substrate of the display panel 300 may be omitted, and the touch sensing device 200 may be formed on an encapsulation film of the display panel 300. Further, the touch sensing device 200 may include a pressure sensor capable of sensing a user's pressure.

To prevent or mitigate external light being reflected by lines of the touch sensing device 200 or lines of the display panel 300 and thereby degrading the visibility of the image displayed by the display panel 300, a polarizing film may be disposed on the touch sensing device 200.

The touch circuit board 210 may be attached to one side of the touch sensing device 200. For example, the touch circuit board 210 may be attached onto pads (e.g., a touch pad TP) provided on one side of the touch sensing device 200 using a first anisotropic conductive film (TACF). Further, a touch connection terminal may be provided on the touch circuit board 210, and the touch connection terminal may be connected to a first connector 330 of the display circuit board 310 as shown in FIG. 3. The touch circuit board 210 may be a flexible printed circuit board or a chip on film.

A touch driving circuit 220 may apply touch driving signals to the touch sensing device 200, sense sensing signals from the touch driving circuit 220, and analyze the sensing signals to calculate the user's touch position. The touch driving circuit 220 may be formed as an integrated circuit and mounted on the touch circuit board 210.

The display panel 300 may have a display region DA and a non-display region NDA. The display region DA is a region in which an image is displayed, and the non-display region NDA is a region in which the image is not displayed. The non-display region NDA may be a peripheral region of the display region DA. For example, the non-display region NDA may be disposed to surround (e.g., to extend around a periphery of) the display region DA as shown in FIG. 2, but it is not limited thereto. The display region DA may overlap a transmissive part 100DA of the cover window 100, and the non-display region NDA may overlap a light blocking part 100NDA of the cover window 100.

The display panel 300 may include a first substrate 301, the second substrate 303, and a pixel array layer 302 disposed between the first substrate 301 and the second substrate 303.

The first substrate 301 may include (or may be formed of) plastic or glass. When the first substrate 301 is formed of plastic, the first substrate 301 may be formed of polyethersulfone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), or a combination thereof.

The pixel array layer 302 may include a thin film transistor layer and a light emitting element layer using an organic light emitting element as a light emitting element, and sub-pixels thereof may be formed in a matrix form. A detailed description of the pixel array layer 302 will be described later with reference to FIG. 8.

The first substrate 301 and the second substrate 303 may be bonded to each other by a sealant 304. Because the sealant 304 is disposed at an edge of the display panel 300, the pixel array layer 302 may be sealed by the sealant 304.

Display pads DP may be disposed on one side of the first substrate 301, which is not covered by the second substrate 303. Further, a heat dissipation pad 305 may be disposed on the other side (e.g., the opposite side) of the first substrate 301, which is also not covered by the second substrate 303. The heat dissipation pad 305 may be connected to a conductive line electrically connected to at least one of the sub-pixels of the pixel array layer 302.

A detailed description of the display panel 300 will be described later with reference to FIGS. 4 to 9.

The display circuit board 310 may be attached to one side of the display panel 300. For example, one end of the display circuit board 310 may be attached to the display pads DP provided at one side of the display panel 300 through a second anisotropic conductive film (DACF). The other end of the display circuit board 310 may be attached to a lower surface of the panel lower member 400 through an adhesive member 610. The touch circuit board 210 and the display circuit board 310 may be flexible printed circuit boards, and as shown in FIG. 3, may be bent from an upper portion to a lower portion of the display panel 300. The display circuit board 310 may be connected to a touch connection terminal of the touch circuit board 210 through the first connector 330.

Figure 4:
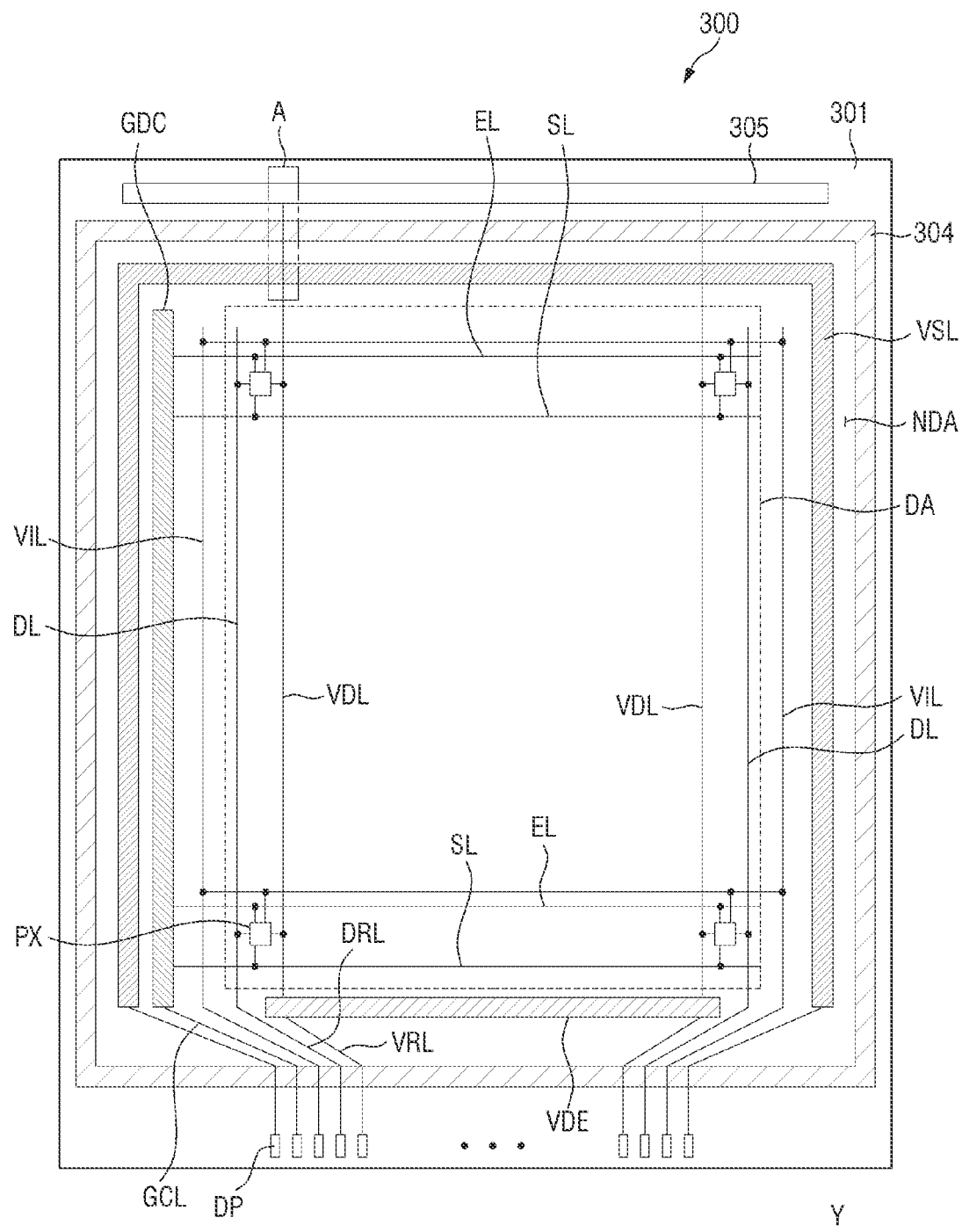
FIG. 4 is a plan view of a display panel shown in FIG. 3.

A display driving circuit 320 outputs signals and voltages for driving the display panel 300 through the display circuit board 310. For example, the display driving circuit 320 may receive digital video data and timing signals from the outside and may convert the digital video data to analog positive/negative data voltages to supply the analog positive/negative data voltages to data lines DL through the display pads DP. Further, the display driving circuit 320 generates and supplies a scan control signal for controlling a scan driving part (e.g., a scan driver) GDC through scan control lines SCL. In addition, the display driving circuit 320 may output power voltages to drive the sub-pixels of the display panel 300 including, for example, a first power voltage supplied to first power voltage lines VDL, a second power voltage supplied to a second power voltage line VSL, and an initialization voltage supplied to initialization voltage lines VIL to the display pads DP as shown in FIG. 4.

The display driving circuit 320 may be formed as an integrated circuit and mounted on the display circuit board 310, but it is not limited thereto. For example, the display driving circuit 320 may be attached to one side of the display panel 300.

The panel lower member 400 may be disposed on the lower surface of the display panel 300. The panel lower member 400 may include at least one of a heat dissipation layer for efficiently dissipating heat from the display panel 300, an electromagnetic wave shielding layer for shielding electromagnetic waves, a light blocking layer for blocking light incident from the outside, a light absorption layer for absorbing light incident from the outside, and a buffer layer for absorbing an impact from the outside.

The light absorption layer may be disposed under the display panel 300. The light absorption layer prevents or substantially prevents the transmission of light and prevents or substantially prevents elements disposed under the light absorption layer from being visually recognized from the upper portion of the display panel 300. The light absorption layer may include a light absorption material, such as a black pigment or dye.

The buffer layer may be disposed under the light absorption layer. The buffer layer absorbs an external impact and prevents or substantially prevents damage to the display panel 300. The buffer layer may be formed of a single layer or as a plurality of layers. For example, the buffer layer may include (or may be formed of) a polymer resin, such as polyurethane, polycarbonate, polypropylene, or polyethylene, or may include a material having elasticity, such as a sponge formed by foam-molding rubber, a urethane-based material, or an acrylic-based material. The buffer layer may be a cushion layer.

The heat dissipation layer may be disposed under the buffer layer. The heat dissipation layer may include a first heat dissipation layer including graphite or carbon nanotubes and a second heat dissipation layer formed of a metal thin film, such as copper, nickel, ferrite, or silver, capable of shielding electromagnetic waves and having excellent thermal conductivity.

The heat dissipation sheet 500 may be attached to the other side of the display panel 300. For example, the heat dissipation sheet 500 may be attached to the heat dissipation pad 305 provided at the other side of the display panel 300 through an insulating heat dissipation adhesive layer 510. The insulating heat dissipation adhesive layer 510 may be a thermally conductive silicone adhesive. The heat dissipation sheet 500 may include graphite or a metal material having high thermal conductivity, such as copper, nickel, ferrite, silver, or the like.

The heat dissipation sheet 500 may be disposed on a portion of an upper surface of the first substrate 301, one side surface of the first substrate 301, and a portion of a lower surface of the first substrate 301. Further, the heat dissipation sheet 500 may be disposed on one side surface of the second substrate 303 of the display panel 300 and on one side surface of the touch sensing device 200. For example, the heat dissipation sheet 500 may be formed in a "⊏" shape as shown in FIG. 3 and may be disposed to surround one side, for example, an upper side surface of the first substrate 301.

The lower cover 800 may be disposed under the panel lower member 400. The lower cover 800 may form an exterior of a lower surface of the display device 10. The lower cover 800 may be formed like a bowl to accommodate the display panel 300. Sidewalls of the lower cover 800 may contact an edge of the cover window 100. In such an embodiment, the sidewalls of the lower cover 800 may be adhered to the edge of the cover window 100 through an adhesive member.

The lower cover 800 may be fastened to the panel lower member 400 and/or the heat dissipation sheet 500 through a fixing member, such as a screw, or may be attached to the panel lower member 400 and/or the heat dissipation sheet 500 through an adhesive member, such as an adhesive or adhesive tape. The lower cover 800 may include plastic and/or a metal. The lower cover 900 may include stainless steel (SUS) or aluminum (Al) to increase heat dissipation. In such an embodiment, heat dissipated to the heat dissipation sheet 500 may be effectively dissipated to the outside through the lower cover 800.

When the display device 10, according to an embodiment, is applied to an automobile, the display device 10 may be designed to inject air (e.g., wind) from an air conditioner into a space between the panel lower member 400 and the lower cover 800 to lower an internal temperature of the display device 10.

According to the embodiment shown in FIGS. 1 to 3, heat transferred to the heat dissipation pad 305 of the display panel 300 through the insulating heat dissipation adhesive layer 510 and the heat dissipation sheet 500 may be dissipated. Accordingly, deterioration of characteristics of the display device 10 or a reduction of the lifespan of the display device 10 due to an increase in internal temperature of the display device 10 may be improved.

FIG. 4 is a plan view illustrating of the display panel shown in FIG. 3.

In FIG. 4, the second substrate 303 of the display panel 300 is omitted for convenience of description. Further, in FIG. 4, only sub-pixels PX, scan lines SL, light emission control lines EL, the data lines DL, the initialization voltage lines VIL, the first power voltage lines VDL, the second power voltage line VSL, the sealant 304, the heat dissipation pad 305, the display pads DP, and the scan driving part GDC of the display panel 300 are shown for convenience of description.

Referring to FIG. 4, the sub-pixels PX are disposed in the display region DA. Each of sub-pixels PX may be connected to at least one of the scan lines SL, at least one of the light emission control lines EL, at least one of the data lines DL, at least one of the first power lines VDL, and at least one of the initialization voltage lines VIL. A detailed description of the sub-pixels PX will be described later with reference to FIG. 6.

The scan lines SL and the light emission control lines EL may be formed parallel to each other in the first direction (X-axis direction). The data lines DL and the first power lines VDL may be formed parallel to each other in the second direction (Y-axis direction), which crosses (or intersects) the first direction (X-axis direction).

The data lines DL may be electrically connected to the display pads DP through data routing lines DRL. Accordingly, the data lines DL may receive data voltages. Some of the data routing lines DRL may overlap a first power voltage electrode VDE. In such an embodiment, the data routing lines DRL may be disposed on the first power voltage electrode VDE.

The first power lines VDL may be connected to the first power voltage electrode VDE disposed in the non-display region NDA. The first power voltage electrode VDE may be disposed at a lower outer side of the display region DA. The first power voltage electrode VDE may be electrically connected to the display pads DP through first power routing lines VRL. Accordingly, the first power voltage electrode VDE may receive the first power voltage.

The initialization voltage lines VIL may be formed in parallel in the second direction (Y-axis direction) in the non-display region NDA. The initialization voltage lines VIL may be formed in parallel in the first direction (X-axis direction) in the display region DA. Accordingly, the initialization voltage lines VIL formed in the second direction (Y-axis direction) in the non-display region NDA may be connected to the initialization voltage lines VIL that are in parallel in the first direction (X-axis direction) in the display region DA. The initialization voltage lines VIL formed in the second direction (Y-axis direction) in the non-display region NDA may be connected to the display pads DP to receive the initialization voltage. The initialization voltage may be a voltage lower than the first power voltage.

The scan driving part GDC may be disposed at a left side of the first substrate 301 as shown in FIG. 4, but it is not limited thereto. The scan driving part GDC may be disposed at a right side of the first substrate 301 or may be disposed at both the left and right sides of the first substrate 301. The scan driving part GDC may be disposed in the non-display region NDA. The scan driving part GDC may be disposed at a left outer side of the initialization voltage line VIL disposed at a left outer side of the display region DA.

The scan driving part GDC receives scan control signals through the scan control line GCL which connects the scan driving part GDC and the display pad DP. The scan driving part GDC may generate the scan signals and light emission control signals based on the scan control signals. The scan driving part GDC may output the scan signals to the scan lines SL and may output the light emission control signals to the light emission control lines EL.

The second power voltage line VSL may be disposed in the non-display region NDA and may be disposed at outer sides of at least three sides of the display region DA. For example, the second power voltage line VSL may be disposed at left, upper, and right outer sides of the display region DA as shown in FIG. 4. The second power voltage line VSL may be connected to the display pads DP to receive a ground voltage or a second power voltage. The second power voltage may be a voltage lower than the first power voltage. Because the second power voltage line VSL surrounds (e.g., extends around at least a part of the periphery of) the display region DA, external static electricity may be discharged by the second power voltage line VSL. Accordingly, the display region DA may be protected from external static electricity. Further, the second power voltage line VSL may be connected to a cathode of the light emitting element layer EML, which is formed to cover the display region DA. For example, the second power voltage line VSL may be electrically connected to the cathode of each of the sub-pixels PX.

The sealant 304 may be disposed in the non-display region NDA and may be disposed to surround (e.g., to extend around the periphery of) the display region DA. For example, the sealant 304 may be disposed at left, upper, right, and lower outer sides of the display region DA as shown in FIG. 4. The sealant 304 may be disposed at an outer side of the second power voltage line VSL at the left, upper, and right outer sides of the display region DA.

The sealant 304 may be a glass frit, a photocurable sealant, or a thermosetting sealant. When the sealant 304 is a glass frit, after melting the glass frit through laser, the first substrate 301 and the second substrate 303 may be bonded to each other while the molten frit is solidified. When the sealant 304 is a photocurable sealant or thermosetting sealant, after applying the photocurable sealant or thermosetting sealant on the first substrate 301 and disposing the second substrate 303, ultraviolet (UV) rays are irradiated or heat is applied to cure the sealant, and thus, the first substrate 301 and the second substrate 303 may be bonded to each other.

The display pads DP and the heat dissipation pad 305 are disposed in the non-display region NDA. The display pads DP may be disposed at the edge of one side of the first substrate 301, and the heat dissipation pad 305 may be disposed at the edge of the other side of the first substrate 301. For example, the display pads DP may be disposed at a lower edge of the first substrate 301, and the heat dissipation pad 305 may be disposed at an upper edge of the first substrate 301. The heat dissipation pad 305 may be disposed at an outer side of the sealant 304. For example, the heat dissipation pad 305 may be disposed at an upper outer side of the sealant 304.

Figure 5:
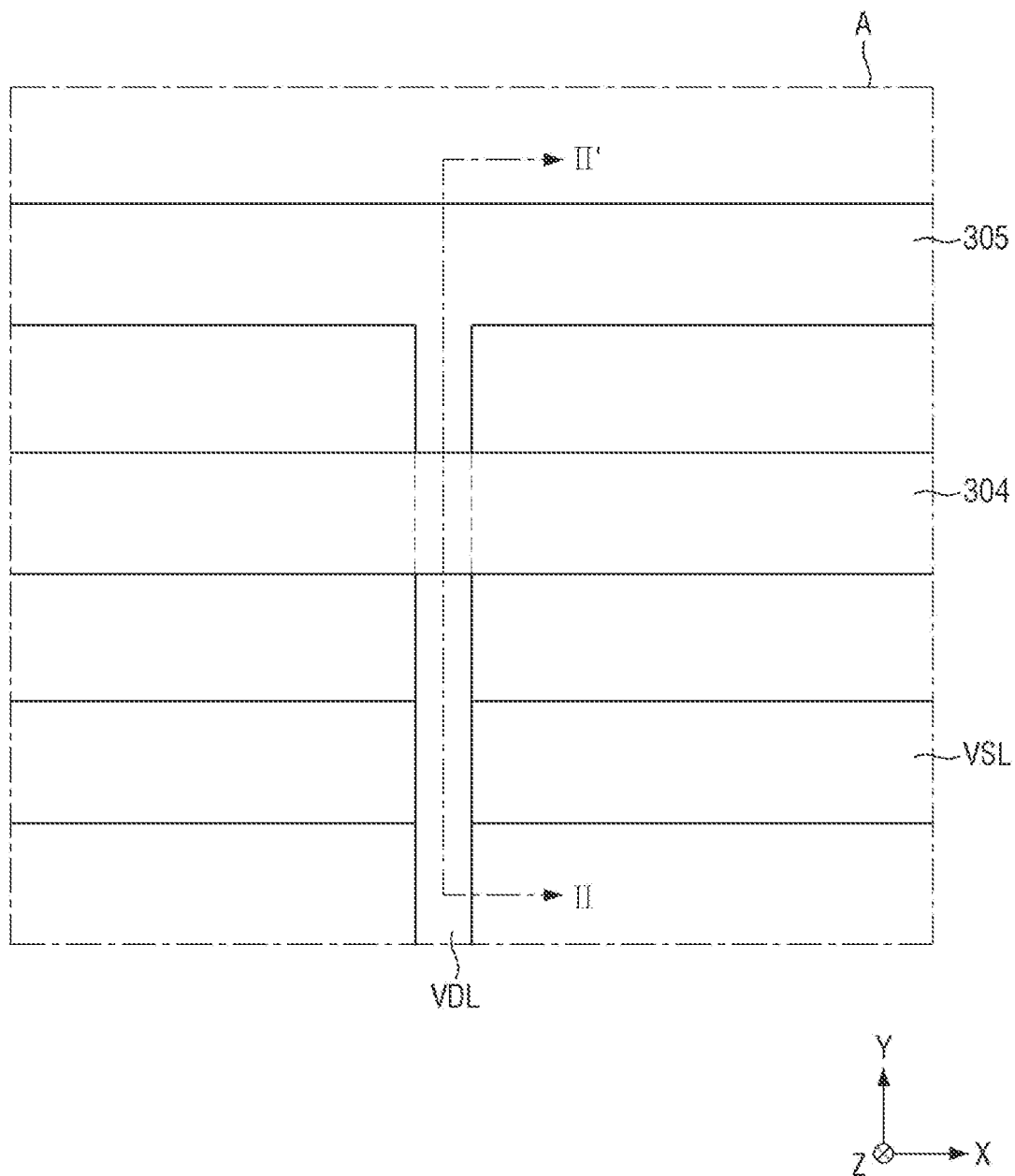
FIG. 5 is an enlarged plan view of the region A in FIG. 4.

The heat dissipation pad 305 may be connected to conductive lines electrically connected to at least one of the sub-pixels PX, for example, the first power voltage lines VDL. In such an embodiment, the first power voltage lines VDL may cross the second power voltage line VSL and the sealant 304 at the upper outer side of the display region DA as shown in FIG. 5. FIG. 5 illustrates that the first power voltage lines VDL are disposed on the second power voltage line VSL, and the sealant 304 is disposed on the first power voltage lines VDL. Further, FIG. 5 illustrates that the first power voltage lines VDL are disposed on the same layer as the heat dissipation pad 305.

Figure 6:
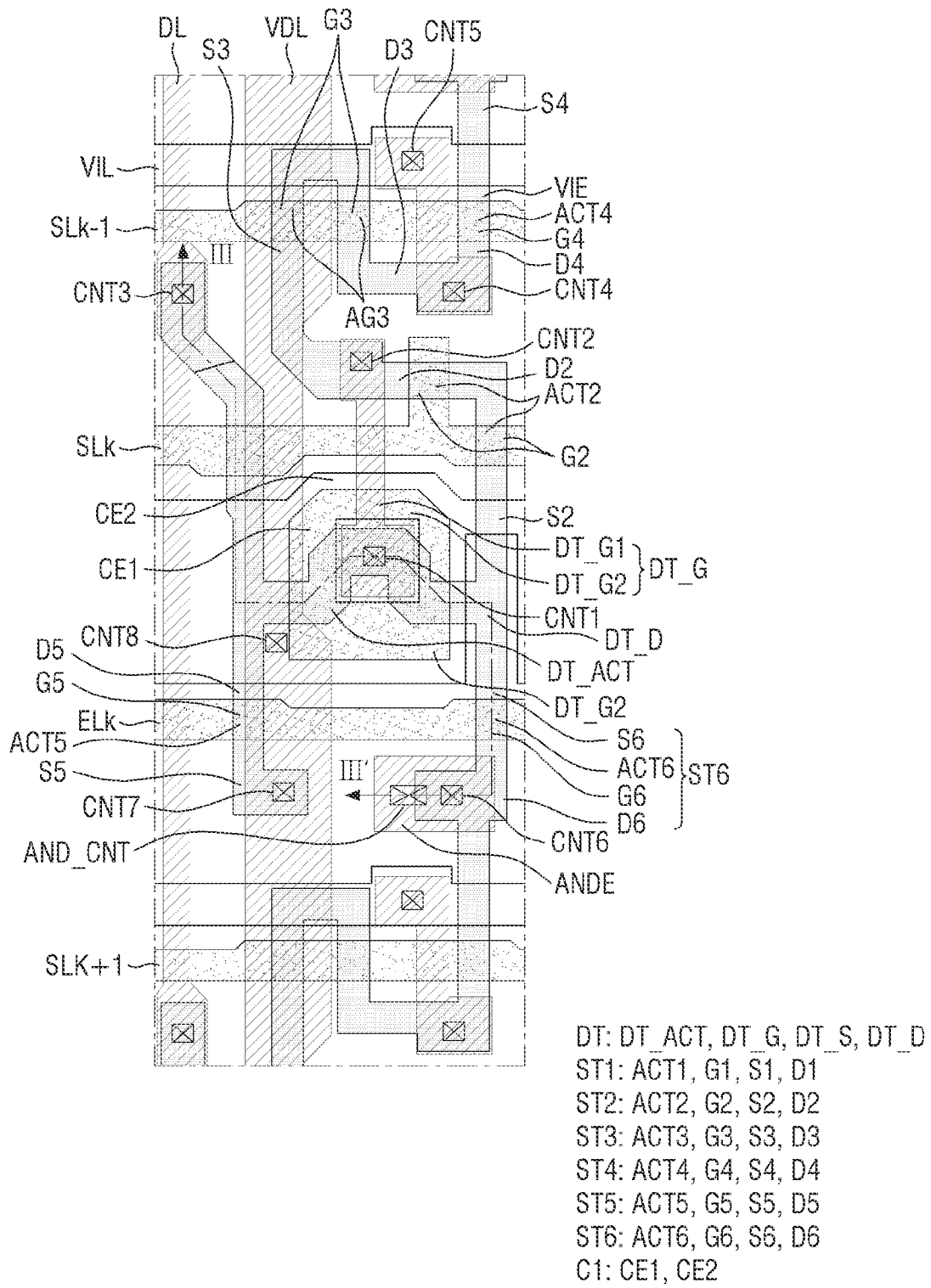
FIG. 6 is a plan view illustrating sub-pixels shown in FIG. 4.

FIG. 6 is a plan view illustrating the sub-pixels shown in FIG. 4.

FIG. 6 illustrates that each of the sub-pixels PX includes seven transistors DT and ST1 to ST6 and one capacitor C1, but the present disclosure is not limited thereto.

Referring to FIG. 6, each of the sub-pixels PX may include a driving transistor DT, first to sixth switching transistors ST1 to ST6, and a capacitor C1.

The driving transistor DT may include a driving active layer DT_ACT, a driving gate electrode DT_G, a driving source electrode DT_S, and a driving drain electrode DT_D. The driving active layer DT_ACT may overlap the driving gate electrode DT_G. The driving gate electrode DT_G may include a first driving gate electrode DT_G1 and a second driving gate electrode DT_G2. The second driving gate electrode DT_G2 may be disposed on the first driving gate electrode DT_G1, and the first driving gate electrode DT_G1 and the second driving gate electrode DT_G2 may be connected to each other through a first contact opening (e.g., a first contact hole) CNT1. The first driving gate electrode DT_G1 may overlap the driving active layer DT_ACT, and the second driving gate electrode DT_G2 may be connected to a drain electrode D2 of the second switching transistor ST2 through a second contact opening (e.g., a second contact hole) CNT2. The driving source electrode DT_S may be connected to a drain electrode D1 of the first switching transistor ST1. The driving drain electrode DT_D may be connected to a source electrode S2 of the second switching transistor ST2 and a source electrode S6 of the sixth switching transistor ST6.

The first switching transistor ST1 may include a first active layer ACT1, a first gate electrode G1, a first source electrode S1, and the first drain electrode D1. The first gate electrode G1 is a part of a k-th scan line SLk (k is a positive integer greater than or equal to two) and may be an overlapping region between the first active layer ACT1 and the k-th scan line SLk. The first source electrode S1 may be connected to the data line DL through a third contact opening (e.g., a third contact hole) CNT3. The first drain electrode D1 may be connected to the source electrode DT_S of the driving transistor DT.

The second switching transistor ST2 may include a second active layer ACT2, a second gate electrode G2, the second source electrode S2, and the second drain electrode D2. The second gate electrode G2 is a part of the k-th scan line SLk and may be an overlapping region between the second active layer ACT2 and the k-th scan line SLK. The second source electrode S2 may be connected to the drain electrode DT_D of the driving transistor DT. The second drain electrode D2 may be connected to the gate electrode DT_G of the driving transistor DT.

The second switching transistor ST2 may be formed as a dual transistor. In such an embodiment, the second switching transistor ST2 may include two second active layers ACT2 and two second gate electrodes G2 as shown in FIG. 6.

The third switching transistor ST3 may include a third active layer ACT3, a third gate electrode G3, a third source electrode S3, and a third drain electrode D3. The third gate electrode G3 is a part of a k−1th scan line SLk−1 and may be an overlapping region between the third active layer ACT3 and the k−1th scan line SLK−1. The third source electrode S3 may be connected to the gate electrode DT_G of the driving transistor DT and the drain electrode D2 of the second switching transistor ST2. The third drain electrode D3 may be connected to the initialization voltage line VIL through a fourth contact opening (e.g., a fourth contact hole) CNT4.

The third switching transistor ST3 may be formed as a dual transistor. In such an embodiment, as shown in FIG. 6, the third switching transistor ST3 may include two third active layers ACT3 and two third gate electrodes G3.

The fourth switching transistor ST4 may include a fourth active layer ACT4, a fourth gate electrode G4, a fourth source electrode S4, and a fourth drain electrode D4. The fourth gate electrode G4 is a part of a k+1th scan line SLk+1 and may be an overlapping region between the fourth active layer ACT4 and the k+1th scan line SLk+1. The fourth source electrode S4 may be connected to an anode AND of the organic light emitting element. The fourth drain electrode D4 may be connected to the initialization voltage line VIL through the fourth contact opening CNT4.

The initialization voltage line VIL is connected to an initialization connection electrode VIE through a fifth contact opening (e.g., a fifth contact hole) CNT5, and the initialization connection electrode VIE may be connected to the drain electrode D3 of the third switching transistor ST3 through the fourth contact opening CNT4. The initialization connection electrode VIE may be disposed to cross the k−1th scan line SLK−1. Further, the anode AND may be connected to an anode connection electrode ANDE through an anode contact opening (e.g., an anode contact hole) AND_CNT, and the anode connection electrode ANDE may be connected to the source electrode S4 of the fourth switching transistor ST4 through a sixth contact opening (e.g., a sixth contact hole) CNT6.

The fifth switching transistor ST5 may include a fifth active layer ACT5, a fifth gate electrode G5, a fifth source electrode S5, and a fifth drain electrode D5. The fifth gate electrode G5 is a part of a k-th light emission control line EMLk and may be an overlapping region between the fifth active layer ACT5 and the k-th light emission control line EMLk. The fifth source electrode S5 may be connected to the source electrode DT_S of the driving transistor DT and the drain electrode D1 of the first switching transistor ST1. The fifth drain electrode D5 may be connected to the first power voltage line VDL through a seventh contact opening (e.g., a seventh contact hole) CNT7.

The sixth switching transistor ST6 may include a sixth active layer ACT6, a sixth gate electrode G6, a sixth source electrode S6, and a sixth drain electrode D6. The sixth gate electrode G6 is a part of the k-th light emission control line EMLk and may be an overlapping region between the sixth active layer ACT6 and the k-th light emission control line EMLk. The sixth source electrode S6 may be connected to the drain electrode DT_D of the driving transistor DT and the source electrode S2 of the second switching transistor ST2. The sixth drain electrode D6 may be connected to the anode AND of the organic light emitting element.

A first electrode CE1 of the capacitor C1 may be substantially the same as the gate electrode DT_G of the driving transistor DT, and a second electrode CE2 of the capacitor C1 may overlap the gate electrode DT_G of the driving transistor DT and may be connected to the first power voltage line VDL through an eighth contact opening (e.g., eight contact hole) CNT8.

Figure 7:
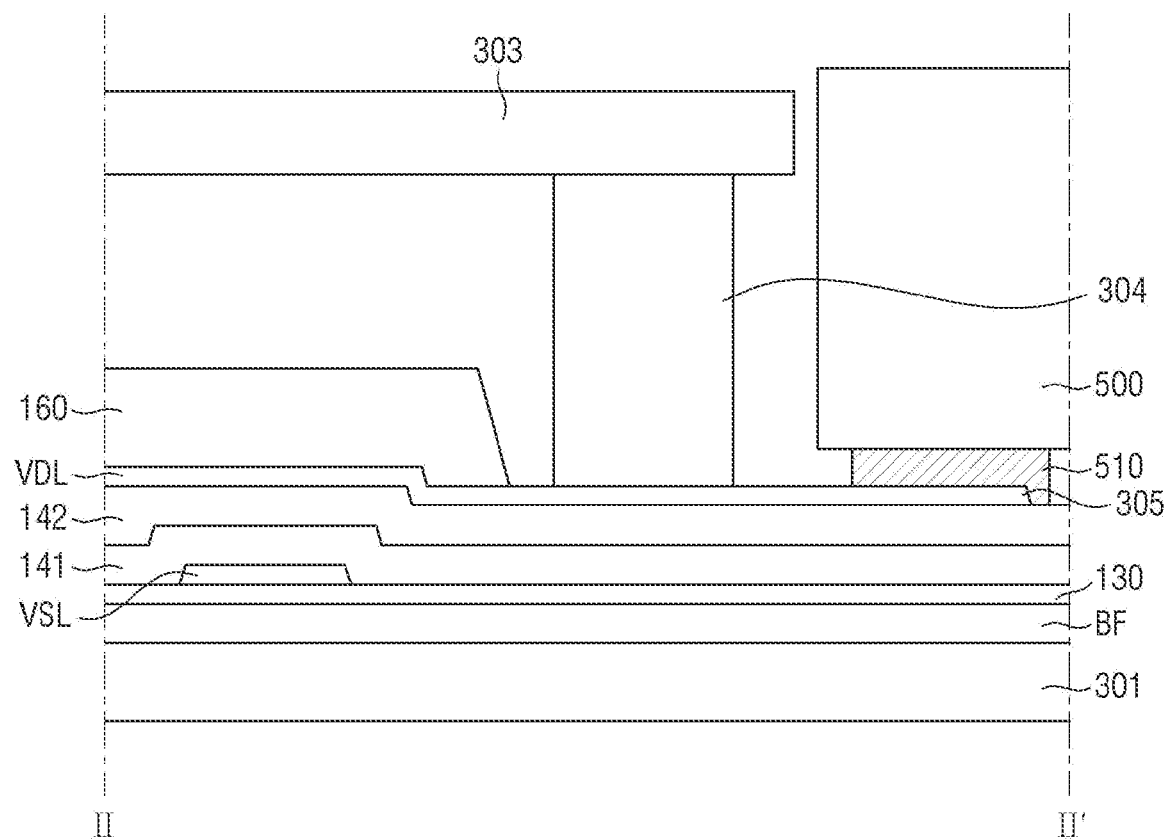
FIG. 7 is a cross-sectional view taken along the line II-II' in FIG. 5.
Figure 8:
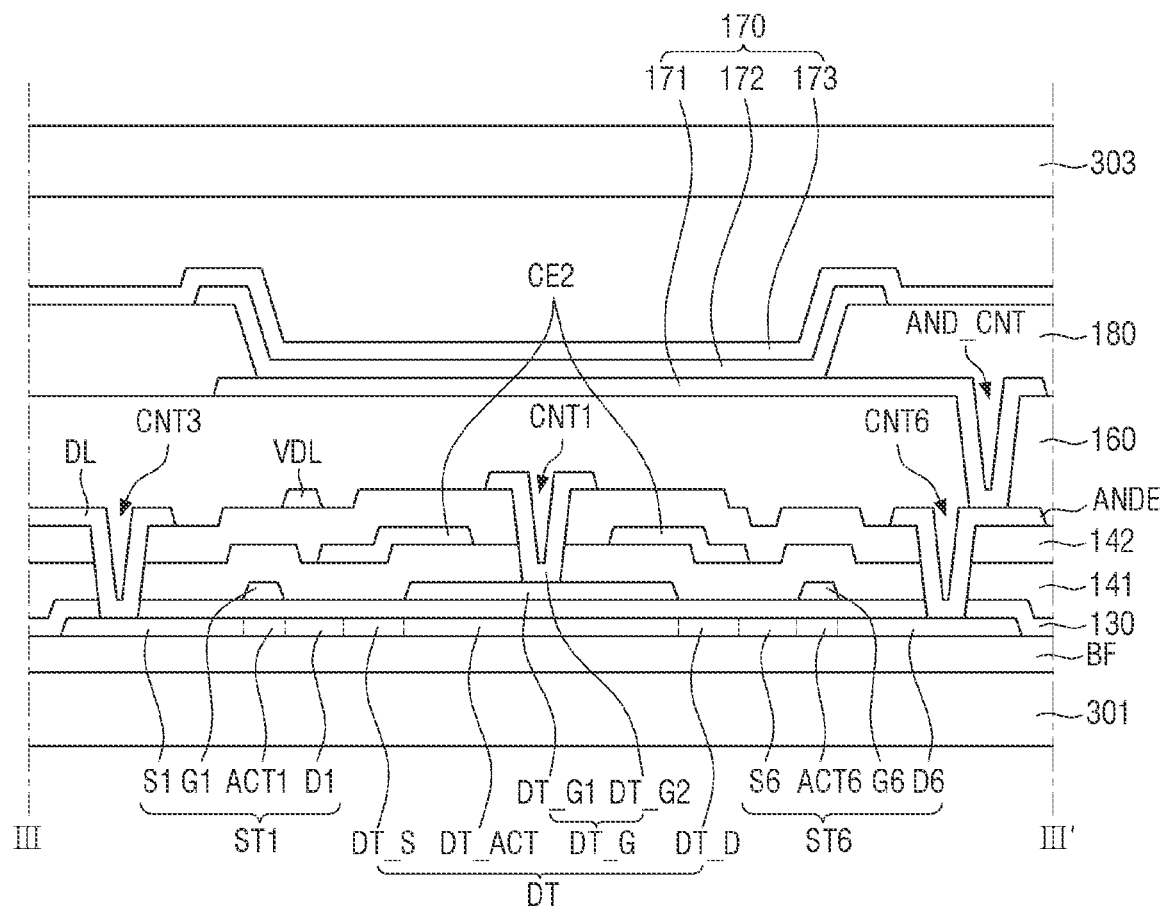
FIG. 8 is a cross-sectional view taken along the line III-III' in FIG. 6.

FIG. 7 is a cross-sectional view taken along the line II-II' in FIG. 5, and FIG. 8 is a cross-sectional view taken along the line III-III' in FIG. 6.

Referring to FIGS. 7 and 8, a thin film transistor layer TFTL and the light emitting element layer EML are formed on the first substrate 301. The thin film transistor layer TFTL includes the active layer ACT, a first gate layer GTL1, a second gate layer GTL2, a data metal layer DTL, a gate insulating film 130, a first interlayer insulating film 141, a second interlayer insulating film 142, a protective film 150, and a planarization film 160.

A buffer film BF may be formed on one surface of the first substrate 301. The buffer film BF may be formed on one surface of the first substrate 301 to protect thin film transistors DT and ST1 to ST6 and an organic light emitting layer 172 of the light emitting element layer EML from moisture penetrating through the first substrate 301, which may be vulnerable to moisture permeation. The buffer film BF may be formed of a plurality of alternately stacked inorganic films. For example, the buffer film BF may be formed as a multilayer stack in which inorganic films including one or more of a silicon nitride layer, a silicon oxynitride layer, a silicon oxide layer, a titanium oxide layer, and an aluminum oxide layer are alternately stacked. In some embodiments, the buffer film BF may be omitted.

Figure 23:
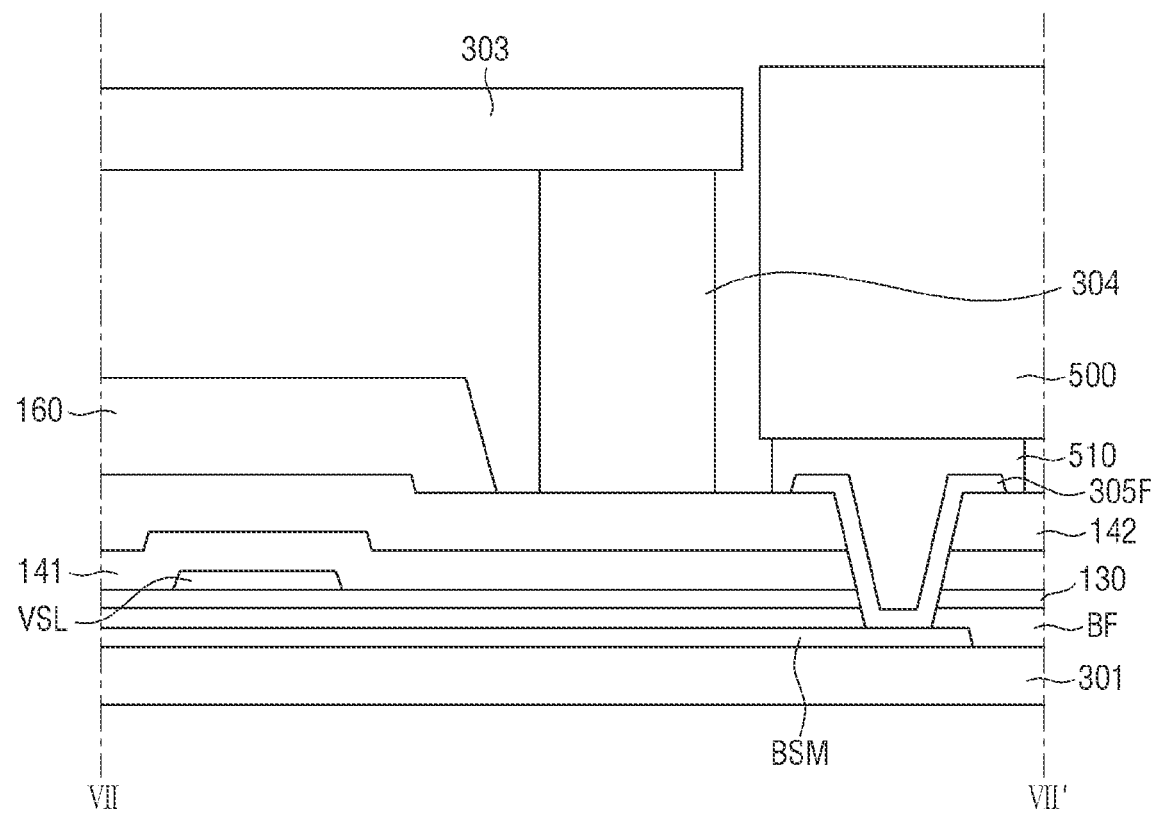
FIG. 23 is a cross-sectional view taken along the line VII-VII' in FIG. 22.

The active layer ACT may be formed on the first substrate 301 or the buffer film BF. The active layer ACT may include polycrystalline silicon, single crystal silicon, low-temperature polycrystalline silicon, amorphous silicon, or an oxide semiconductor. As shown in FIG. 23, light blocking layers BSM for blocking external light incident on the active layer ACT may be formed under the active layer ACT.

When the active layer ACT is made of polycrystalline silicon, the active layer ACT is doped with ions, and the ion-doped active layer ACT may have conductivity. Accordingly, the active layer ACT may include the source electrodes and the drain electrodes as well as the active layers of the driving transistor DT and the first to sixth switching transistors ST1 to ST6.

The gate insulating film 130 may be formed on the active layer ACT. The gate insulating film 130 may be formed of an inorganic film, for example, a silicon nitride layer, a silicon oxynitride layer, a silicon oxide layer, a titanium oxide layer, or an aluminum oxide layer.

The first gate layer GTL1 may be formed on the gate insulating film 130. The first gate layer GTL1 may include the first gate electrode DT_G1 of the driving transistor DT, the scan lines SL, the light emission control lines EL, and the second power voltage line VSL. The first gate layer GTL1 may be formed as a single layer or as a plurality of layers formed of any one of molybdenum (Mo), aluminum (Al), chromium (Cr), gold (Au), titanium (Ti), nickel (Ni), neodymium (Nd), and copper (Cu), or an alloy thereof.

The first interlayer insulating film 141 may be formed on the first gate layer GTL1. The first interlayer insulating film 141 may be formed of an inorganic film, for example, a silicon nitride layer, a silicon oxynitride layer, a silicon oxide layer, a titanium oxide layer, or an aluminum oxide layer. The first interlayer insulating film 141 may include a plurality of inorganic films.

The second gate layer GTL2 may be formed on the first interlayer insulating film 141. The second gate layer GTL2 may include the initialization voltage line VIL and the second electrode CE2 of the capacitor C1. The second gate layer GTL2 may be formed as a single layer or a plurality of layers formed of any one of molybdenum (Mo), aluminum (Al), chromium (Cr), gold (Au), titanium (Ti), nickel (Ni), neodymium (Nd), and copper (Cu), or an alloy thereof.

The second interlayer insulating film 142 may be formed on the second gate layer GTL2. The second interlayer insulating film 142 may be formed of an inorganic film, for example, a silicon nitride layer, a silicon oxynitride layer, a silicon oxide layer, a titanium oxide layer, or an aluminum oxide layer. The second interlayer insulating film 142 may include a plurality of inorganic films.

The data metal layer DTL may be formed on the second interlayer insulating film 142. The data metal layer DTL may include the data lines DL, the first power voltage lines VDL, the second gate electrode DT_G2 of the driving transistor DT, the anode connection electrode ANDE, and the initialization connection electrode VIE. The data metal layer DTL may be formed as a single layer or a plurality of layers formed of any one of molybdenum (Mo), aluminum (Al), chromium (Cr), gold (Au), titanium (Ti), nickel (Ni), neodymium (Nd), and copper (Cu), or an alloy thereof.

The planarization film 160 for flattening a step due to the active layer ACT, the first gate layer GTL1, the second gate layer GTL2, and the data metal layer DTL may be formed on the data metal layer DTL. The planarization film 160 may be formed of an organic film, such as an acrylic resin, an epoxy resin, a phenolic resin, a polyamide resin, a polyimide resin, or the like.

The protective film 150 may be additionally formed between the data metal layer DTL and the planarization film 160. The protective film 150 may be formed of an inorganic film, for example, a silicon nitride layer, a silicon oxynitride layer, a silicon oxide layer, a titanium oxide layer, or an aluminum oxide layer.

FIG. 8 illustrates that the driving transistor DT, the first switching transistor ST1, and the sixth switching transistor ST6 having an upper gate (e.g., top gate) manner in which a gate electrode is located above the active layer, but it should be noted that the present specification is not limited thereto. For example, the driving transistor DT, the first switching transistor ST1, and the sixth switching transistor ST6 may be formed in a lower gate (e.g., bottom gate) manner in which a gate electrode is located below the active layer or in a double gate manner in which the gate electrode is located both above and below the active layer. Further, the second to fifth switching transistors ST2 to ST5 may also be formed in the upper gate manner, the lower gate manner, or the double gate manner.

The light emitting element layer EML is formed on the thin film transistor layer TFTL. The light emitting element layer EML includes light emitting elements 170 and a pixel definition film 180.

The light emitting elements 170 and the pixel definition film 180 are formed on the planarization film 160. Each of the light emitting elements 170 may include a first electrode 171 (e.g., the anode AND), the organic light emitting layer 172, and a second electrode 173.

The first electrode 171 may be formed on the planarization film 160. The first electrode 171 is connected to a source electrode 123 of the thin film transistor 120 through a contact opening (e.g., a contact hole) passing through the protective film 150 and the planarization film 160.

In a top emission structure in which light is emitted in a direction of the second electrode 173 with respect to the organic light emitting layer 172, the first electrode 171 may be formed of a metal material having high reflectivity, such as a laminated structure of aluminum and titanium (Ti/Al/Ti), a laminated structure of aluminum and ITO (ITO/Al/ITO), an APC alloy, and a laminated structure of an APC alloy and ITO (ITO/APC/ITO). The APC alloy is an alloy of silver (Ag), palladium (Pd), and copper (Cu).

The pixel definition film 180 may be formed to partition the first electrode 171 on the planarization film 160 to define the sub-pixels PX. The pixel definition film 180 may be formed to cover an edge of the first electrode 171. The pixel definition film 180 may be formed of an organic film, such as an acrylic resin, an epoxy resin, a phenolic resin, a polyamide resin, a polyimide resin, or the like.

In each of the sub-pixels PX, the first electrode 171, the organic light emitting layer 172, and the second electrode 173 are sequentially stacked to denote a region where holes from the first electrode 171 and electrons from the second electrode 173 are combined in the organic light emitting layer 172 and, thus, light is emitted. The sub-pixels PX may include a red sub-pixel which emits red light, a green sub-pixel which emits green light, and a blue sub-pixel which emits blue light.

The organic light emitting layer 172 is formed on the first electrode 171 and the pixel definition film 180. The organic light emitting layer 172 may emit light of a certain color (e.g., a predetermined color) by including an organic material. For example, the organic light emitting layer 172 may include a hole transporting layer, an organic material layer, and an electron transporting layer. In such an embodiment, the organic light emitting layer 172 of the red sub-pixel may emit red light, the organic light emitting layer 172 of the green sub-pixel may emit green light, and the organic light emitting layer 172 of the blue sub-pixel may emit blue light. In other embodiments, the organic light emitting layers 172 of the sub-pixels PX may emit white light. In such an embodiment, the red sub-pixel may overlap a red color filter layer, the green sub-pixel may overlap a green color filter layer, and the blue sub-pixel may overlap a blue color filter layer.

The second electrode 173 is formed on the organic light emitting layer 172. The second electrode 173 may be formed to cover the organic light emitting layer 172. The second electrode 173 may be a common layer commonly formed in the sub-pixels PX. A capping layer may be formed on the second electrode 173.

In the top emission structure, the second electrode 173 may be formed of a transparent conductive material (TCO), such as ITO and IZO, that can transmit light, or a semi-transmissive conductive material, such as magnesium (Mg), silver (Ag), or an alloy of magnesium (Mg) and silver (Ag). When the second electrode 173 is formed of a semi-transmissive metal material, light emission efficiency may be increased due to a micro cavity.

The second substrate 303 is disposed on the light emitting element layer EML. A space between the light emitting element layer EML and the second substrate 303 may be empty and in a vacuum state. In other embodiments, a filling film may be disposed between the light emitting element layer EML and the second substrate 303. In such an embodiment, the filling film may be an epoxy filling film or a silicone filling film. In some embodiments, an encapsulation film may be formed between the light emitting element layer EML and the second substrate 303. The encapsulation film may include at least one inorganic layer to prevent or substantially prevent the penetration of oxygen or moisture into the light emitting element layer EML. Further, the encapsulation layer may include at least one organic film to protect the light emitting element layer EML from foreign matter, such as dust.

Because the second power voltage line VSL is formed of the first gate layer GTL1, and the first power voltage lines VDL and the heat dissipation pad 305 are formed of the data metal layer DTL, as shown in FIG. 7, the first power voltage lines VDL may be disposed on the second power voltage line VSL to cross the second power voltage line VSL. Accordingly, the first power voltage lines VDL are not short-circuited with the second power voltage line VSL and may be connected to the heat dissipation pad 305.

The insulating heat dissipation adhesive layer 510 may be disposed on the heat dissipation pad 305, and the heat dissipation sheet 500 may be disposed on the insulating heat dissipation adhesive layer 510. For example, the insulating heat dissipation adhesive layer 510 adheres the heat dissipation sheet 500 to the heat dissipation pad 305. The insulating heat dissipation adhesive layer 510 may be a thermally conductive silicone adhesive. The heat dissipation sheet 500 may include graphite or a metal material having high thermal conductivity, such as copper, nickel, ferrite, or silver. Accordingly, the heat of the first power voltage lines VDL may be dissipated through the heat dissipation pad 305, the insulating heat dissipation adhesive layer 510, and the heat dissipation sheet 500. Accordingly, deterioration of characteristics of the display device 10 or a reduction of the lifespan of the display device 10 due to an increase in internal temperature of the display device 10 may be improved.

As shown in FIG. 7, the sealant 304 may be disposed on the first power voltage lines VDL and the planarization film 160. In such an embodiment, because the first power voltage lines VDL may be exposed to the outside, the pixel definition film 180 may be disposed to cover the first power voltage lines VDL, and the sealant 304 may also be disposed on the pixel definition film 180. In such an embodiment, the insulating heat dissipation adhesive layer 510 may be disposed in a contact opening (e.g., a contact hole) that exposes the heat dissipation pad 305 through the pixel definition film 180.

Figure 9:
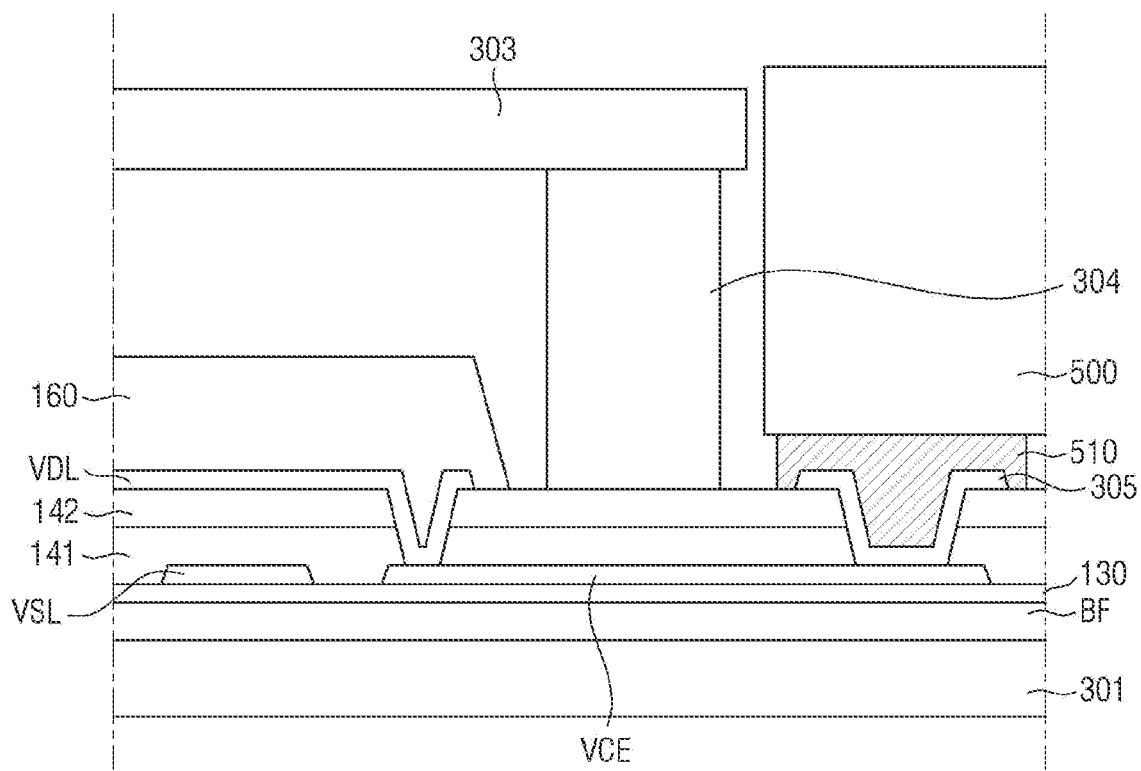
FIG. 9 is a cross-sectional view taken along the line II-II' in FIG. 5 according to another embodiment.

To prevent exposure of the first power voltage lines VDL to the outside, as shown in FIG. 9, the display panel 300 may further include a first power connection electrode VCE which connects each of the first power voltage lines VDL and the heat dissipation pad 305. The first power connection electrode VCE may be formed of the first gate layer GTL1 like the second power voltage line VSL. In such an embodiment, each of the first power voltage lines VDL may be connected to the first power connection electrode VCE through a ninth contact opening (e.g., a ninth contact hole) CNT9 passing through the first interlayer insulating film 141 and the second interlayer insulating film 142 to expose the first power connection electrode VCE. Further, the heat dissipation pad 305 may be connected to the first power connection electrode VCE through a tenth contact opening (e.g., a tenth contact hole) CNT10 passing through the first interlayer insulating film 141 and the second interlayer insulating film 142 to expose the first power connection electrode VCE. The heat dissipation pad 305 may be completely covered by the insulating heat dissipation adhesive layer 510. Further, the first interlayer insulating film 141 and the second interlayer insulating film 142 may be formed on the first power connection electrode VCE, and the sealant 304 may be formed on the second interlayer insulating film 142.

According to the embodiments shown in FIGS. 7 to 9, because the second power voltage line VSL is formed of the first gate layer GTL1, and the first power voltage lines VDL and the heat dissipation pad 305 are formed of the data metal layer DTL, the first power voltage lines VDL may not be short-circuited with the second power voltage line VSL and may be connected to the heat dissipation pad 305. Accordingly, the heat of the first power voltage lines VDL may be dissipated through the heat dissipation pad 305, the insulating heat dissipation adhesive layer 510, and the heat dissipation sheet 500. Accordingly, the deterioration of the characteristics of the display device 10 or the reduction of the lifespan of the display device 10 due to an increase in internal temperature of the display device 10 may be improved.

Figure 10:
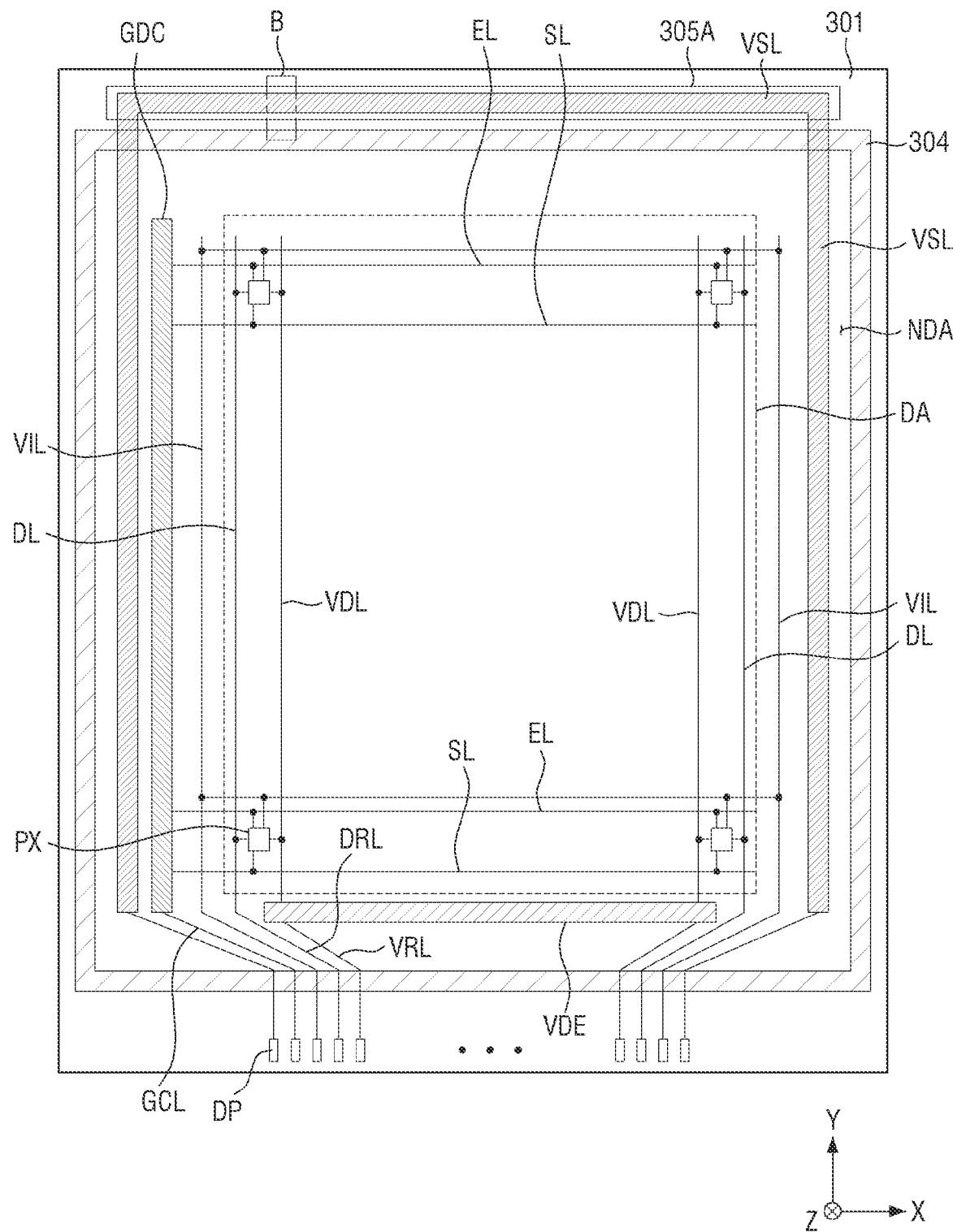
FIG. 10 is a plan view of a display panel according to another embodiment.
Figure 11:
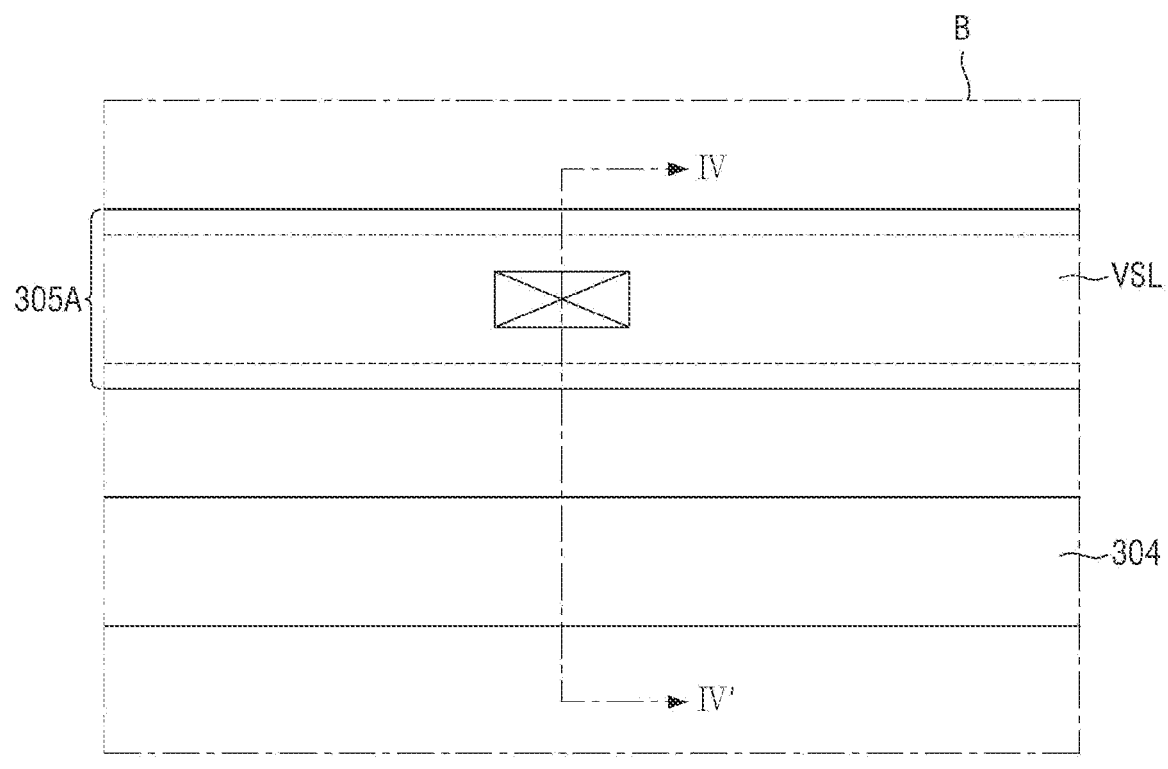
FIG. 11 is an enlarged plan view of the region B in FIG. 10.
Figure 12:
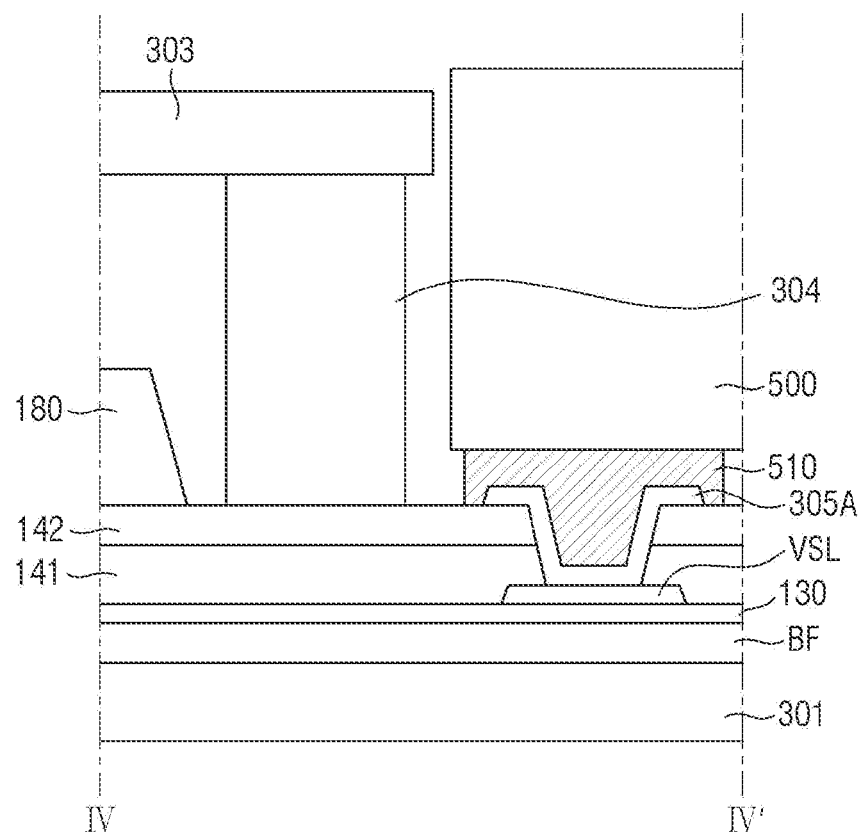
FIG. 12 is a cross-sectional view taken along the line IV-IV' in FIG. 11.

FIG. 10 is a plan view illustrating a display panel according to another embodiment, FIG. 11 is an enlarged plan view of the region B in FIG. 10, and FIG. 12 is a cross-sectional view taken along the line IV-IV' in FIG. 11.

In the embodiment shown in FIGS. 10 to 12, there is a difference from the embodiment shown in FIGS. 4, 5, and 7 in that a heat dissipation pad 305A is disposed on the second power voltage line VSL and is electrically connected to the second power voltage line VSL. In FIGS. 10 to 12, descriptions overlapping the embodiment shown in FIGS. 4, 5, and 7 will be omitted.

The second power voltage line VSL is disposed at an inner side of the sealant 304 at the left and right sides of the first substrate 301 as shown in FIG. 10 but may be disposed at an outer side of the sealant 304 at the upper side of the first substrate 301. Accordingly, the second power voltage line VSL may cross the sealant 304 at the upper left and upper right sides of the first substrate 301. The sealant 304 may be disposed on the second power voltage line VSL.

The heat dissipation pad 305A may be connected to a conductive line electrically connected to at least one of the sub-pixels PX, for example, the second power voltage line VSL. For example, the heat dissipation pad 305A may overlap the second power voltage line VSL disposed on the first substrate 301 as shown in FIG. 11. The heat dissipation pad 305A may be disposed on the second power voltage line VSL and may be connected to the second power voltage line VSL through an eleventh contact opening (e.g., an eleventh contact hole) CNT11. To increase adhesion between the insulating heat dissipation adhesive layer 510 and the heat dissipation pad 305A, a width of the heat dissipation pad 305A in the second direction (Y-axis direction) may be greater than a width of the second power voltage line VSL in the second direction (Y-axis direction).

For example, the heat dissipation pad 305A may be connected to the second power voltage line VSL through the eleventh contact opening CNT11, which passes through the first interlayer insulating film 141 and the second interlayer insulating film 142 to expose the second power voltage line VSL, as shown in FIG. 12. In such an embodiment, the sealant 304 may be formed on the first interlayer insulating film 141 and the second interlayer insulating film 142.

According to the embodiment shown in FIGS. 10 to 12, the second power voltage line VSL may be disposed at an outer side of the sealant 304 at one side of the first substrate 301, and the heat dissipation pad 305A may be disposed on the power voltage line VSL to be connected to the second power voltage line VSL. Accordingly, the heat of the second power voltage line VSL may be dissipated through the heat dissipation pad 305A, the insulating heat dissipation adhesive layer 510, and the heat dissipation sheet 500. Accordingly, the deterioration of the characteristics of the display device 10 or the reduction of the lifespan of the display device 10 due to an increase in internal temperature of the display device 10 may be improved.

Figure 13:
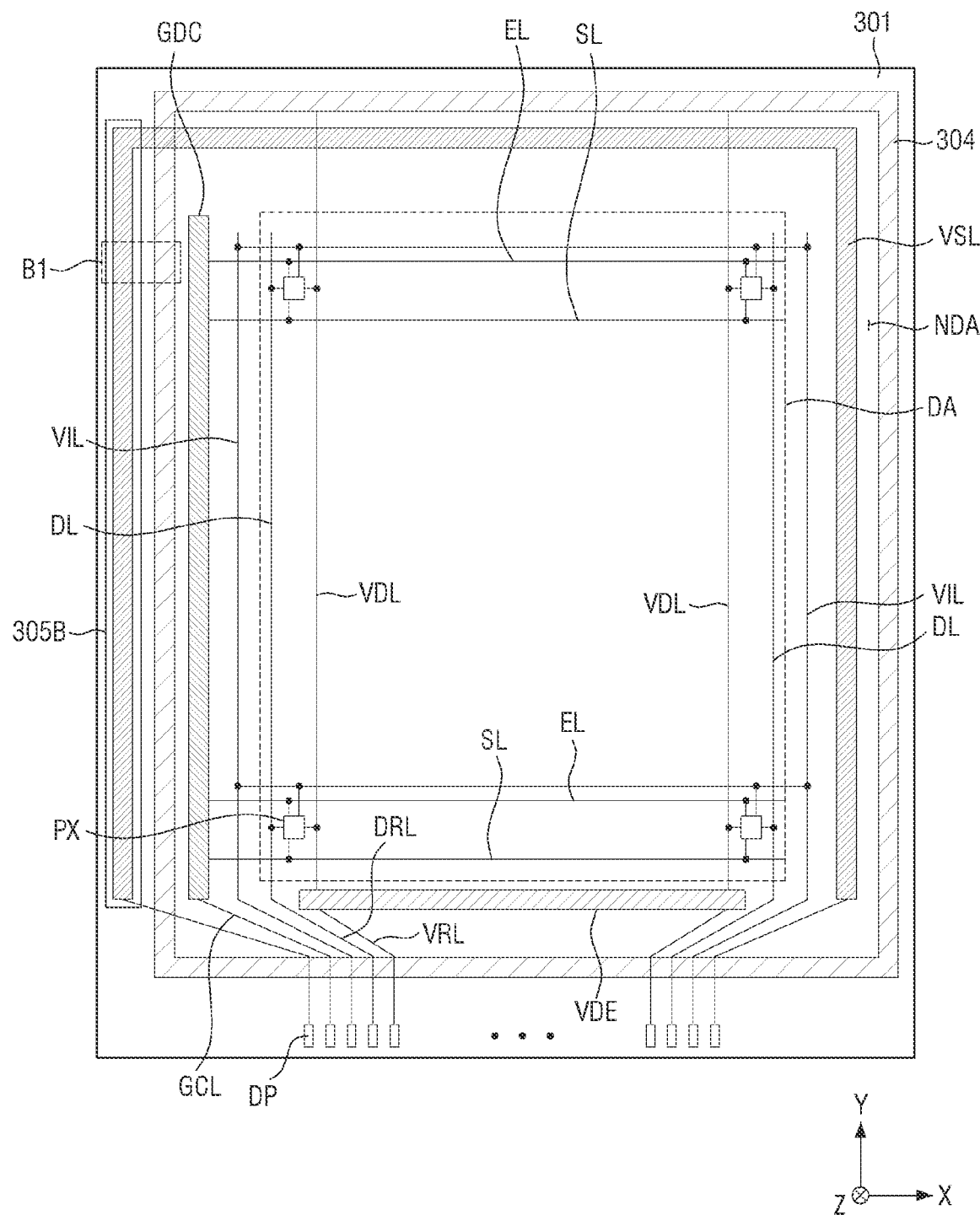
FIG. 13 is a plan view illustrating a display panel according to another embodiment.

FIG. 13 is a plan view illustrating a display panel according to another embodiment.

In the embodiment shown in FIG. 13, there is a difference from the embodiment shown in FIG. 10 in that a heat dissipation pad 305B is disposed at the left side rather than the upper side of the first substrate 301. In FIG. 13, descriptions overlapping the embodiment shown in FIG. 10 will be omitted.

Referring to FIG. 13, the second power voltage line VSL is disposed at an inner side of the sealant 304 at the upper and right sides of the first substrate 301 but may be disposed at an outer side of the sealant 304 at the left side of the first substrate 301. Accordingly, the second power voltage line VSL may cross the sealant 304 at the upper left and upper right sides of the first substrate 301. The sealant 304 may be disposed on the second power voltage line VSL.

The heat dissipation pad 305B may overlap the second power voltage line VSL disposed at the left side of the first substrate 301. For example, the heat dissipation pad 305B may be disposed on the second power voltage line VSL and may be connected to the second power voltage line VSL.

In the embodiment shown in FIG. 13, the heat dissipation pad 305B is disposed at the left side of the first substrate 301, but the present disclosure is not limited thereto. For example, the heat dissipation pad 305B may be disposed at the right side of the first substrate 301, and in such an embodiment, the heat dissipation pad 305B may be disposed on the second power voltage line VSL disposed at the outer side of the sealant 304 at the right side of the first substrate 301 and connected to the second power voltage line VSL.

Because an enlarged plan view of the region B1 in FIG. 13 is substantially the same as that shown in FIG. 11, a detailed description of the enlarged plan view of the region B1 in FIG. 13 will be omitted.

According to the embodiment shown in FIG. 13, the heat dissipation pad 305B may be disposed not only at the upper side of the first substrate 301 but also at the left or right side. In such an embodiment, the heat dissipation sheet 500 may be disposed to surround a corresponding left side surface or a right side surface of the first substrate 301.

Figure 14:
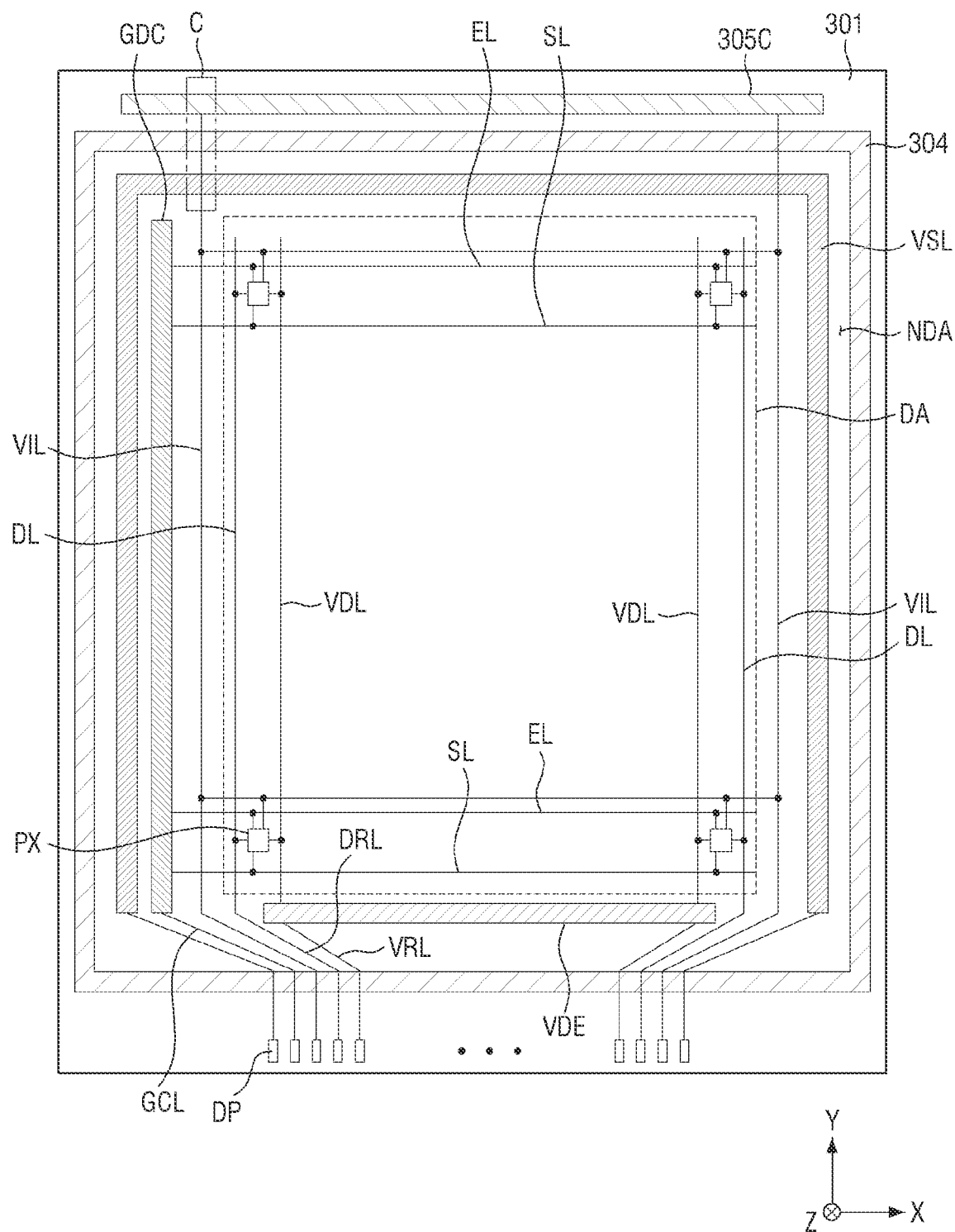
FIG. 14 is a plan view illustrating a display panel according to another embodiment.
Figure 15:
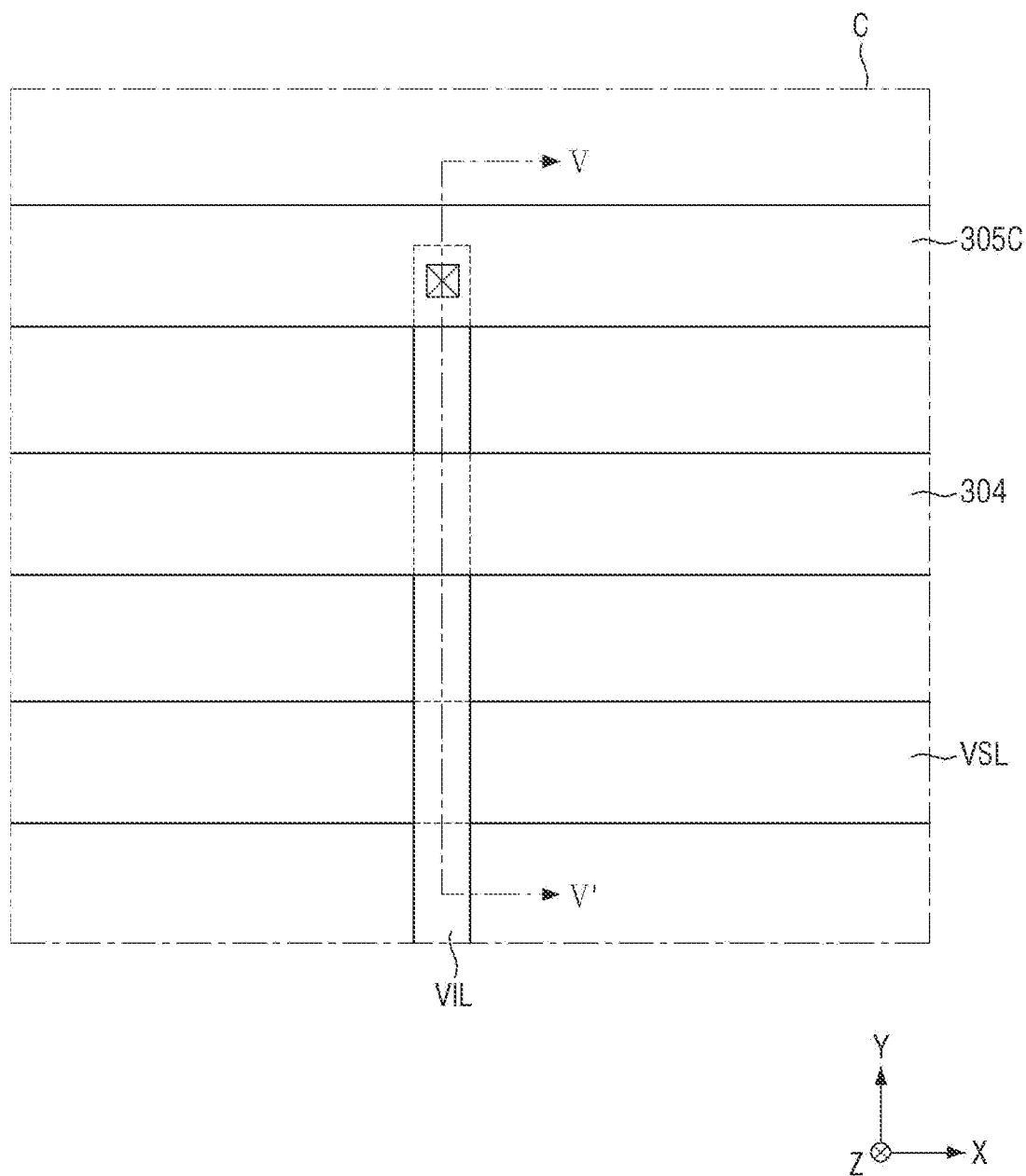
FIG. 15 is an enlarged plan view of the region C in FIG. 14.
Figure 16:
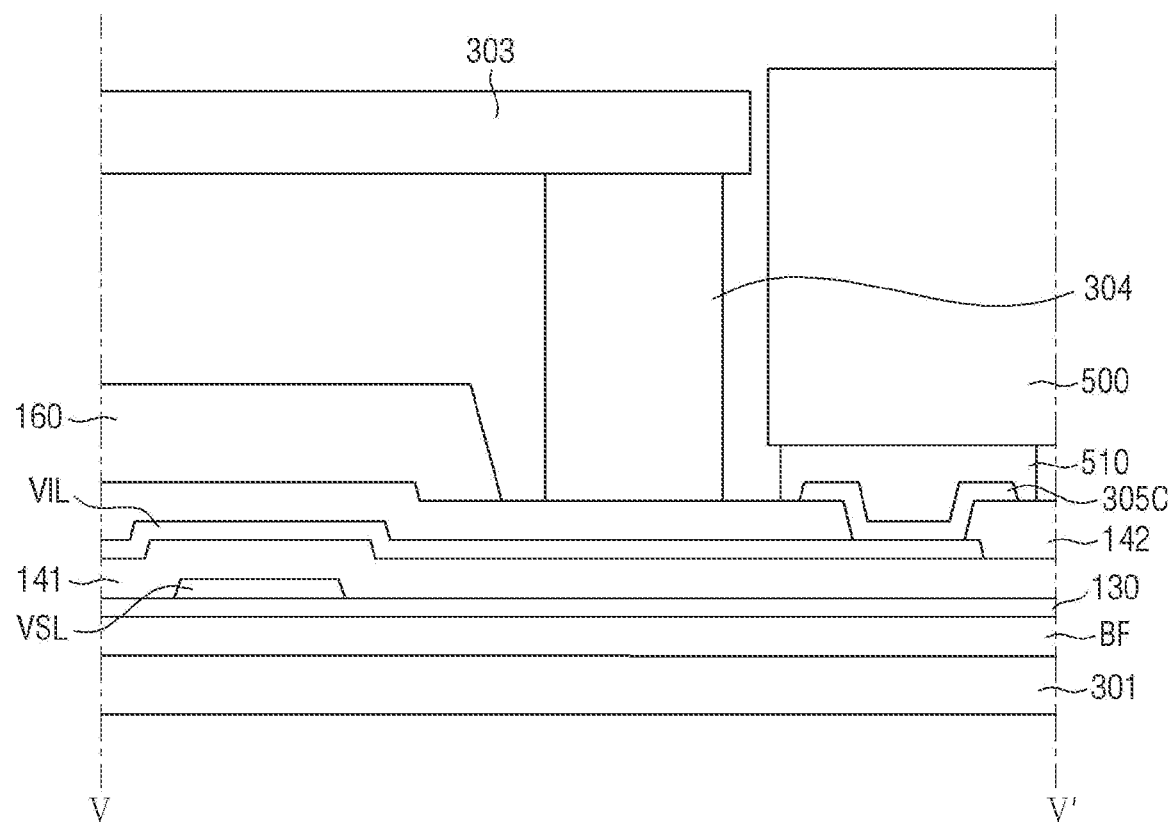
FIG. 16 is a cross-sectional view taken along the line V-V' in FIG. 15.

FIG. 14 is a plan view illustrating a display panel according to another embodiment, FIG. 15 is an enlarged plan view of the region C in FIG. 14, and FIG. 16 is a cross-sectional view taken along the line V-V' in FIG. 15.

In the embodiment shown in FIGS. 14 to 16, there is a difference from the embodiment shown in FIGS. 4, 5, and 7 in that a heat dissipation pad 305C is connected to the initialization voltage lines VIL rather than the first power voltage lines VDL. In FIGS. 14 to 16, descriptions overlapping the embodiment shown in FIGS. 4, 5, and 7 will be omitted.

The heat dissipation pad 305C may be connected to conductive lines electrically connected to at least one of the sub-pixels PX, for example, the initialization voltage lines VIL. In such an embodiment, the initialization voltage lines VIL may cross the second power voltage line VSL and the sealant 304 at the upper outer side of the display region DA as shown in FIG. 14. In the embodiment illustrated in FIG. 14, the initialization voltage lines VIL are disposed on the second power voltage line VSL, and the sealant 304 is disposed on the initialization voltage lines VIL. Further, the heat dissipation pad 305C is illustrated in FIG. 15 as being disposed on the initialization voltage lines VIL. In such an embodiment, the heat dissipation pad 305C may be connected to the initialization voltage lines VIL through twelfth contact openings (e.g., twelfth contact holes) CNT12.

As shown in FIG. 16, because the second power voltage line VSL is formed of the first gate layer GTL1, the initialization voltage lines VIL are formed of the second gate layer GTL2, and the heat dissipation pad 305C is formed of the data metal layer DTL, the initialization voltage lines VIL may be disposed on the second power voltage line VSL to cross the second power voltage line VSL as shown in FIG. 16. Accordingly, the initialization voltage lines VIL are not short-circuited with the second power voltage line VSL and may be connected to the heat dissipation pad 305C.

Further, the heat dissipation pad 305C may be connected to the initialization voltage line VIL through the twelfth contact opening CNT12 passing through the second interlayer insulating film 142 to expose the initialization voltage line VIL. The heat dissipation pad 305C may be completely covered by the insulating heat dissipation adhesive layer 510. Further, the second interlayer insulating film 142 may be formed on the initialization voltage lines VIL, and the sealant 304 may be formed on the second interlayer insulating film 142.

According to the embodiment shown in FIGS. 14 to 16, because the second power voltage line VSL is formed of the first gate layer GTL1, the initialization voltage lines VIL are formed of the second gate layer GTL2, and the heat dissipation pad 305C is formed of the data metal layer DTL, the initialization voltage lines VIL may not be short-circuited with the second power voltage line VSL and may be connected to the heat dissipation pad 305C. Accordingly, the heat of the initialization voltage lines VIL may be dissipated through the heat dissipation pad 305C, the insulating heat dissipation adhesive layer 510, and the heat dissipation sheet 500. Accordingly, the deterioration of the characteristics of the display device 10 or the reduction of the lifespan of the display device 10 due to an increase in internal temperature of the display device 10 may be improved.

Figure 17:
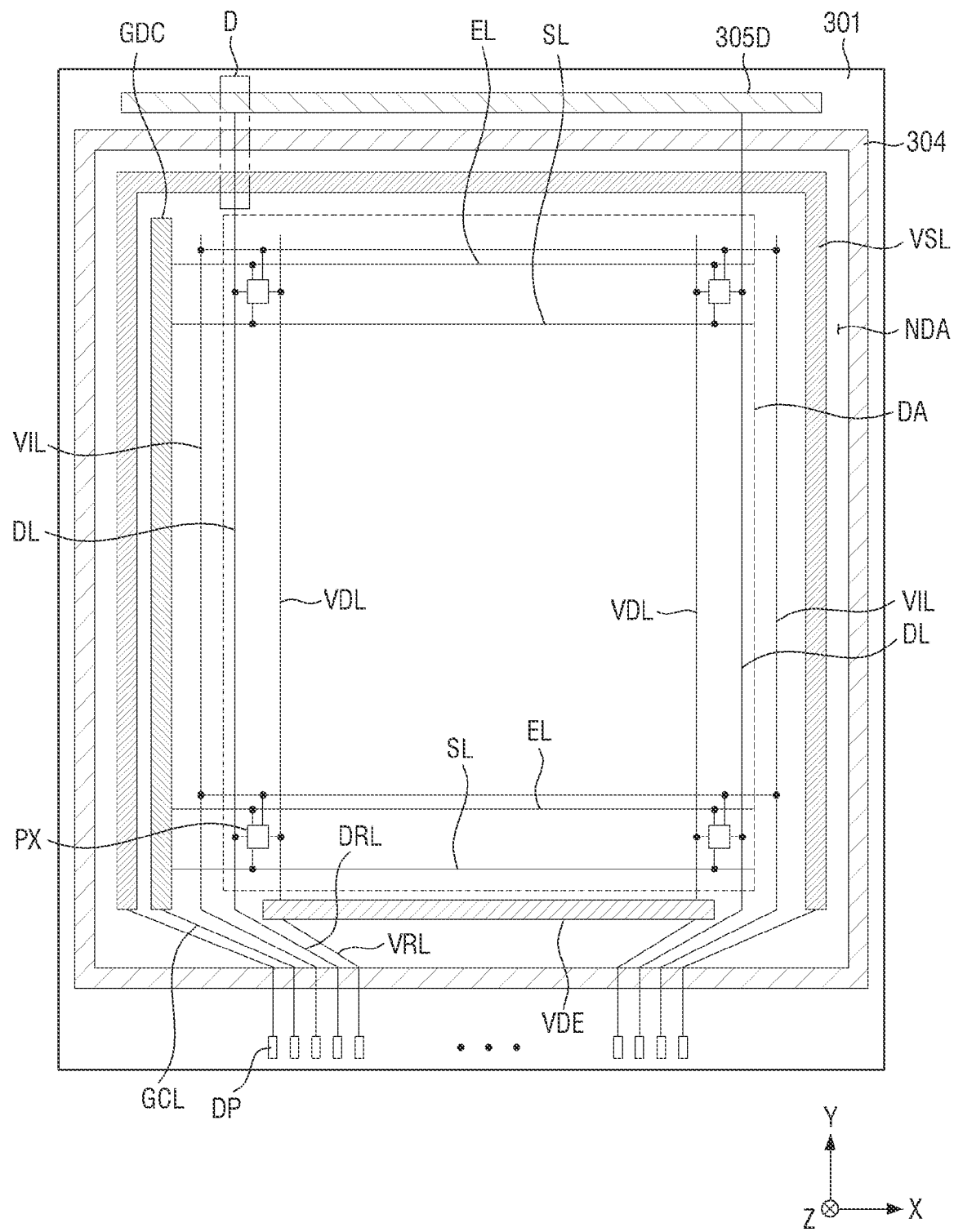
FIG. 17 is a plan view illustrating a display panel according to another embodiment.

FIG. 17 is a plan view illustrating a display panel according to another embodiment.

In the embodiment shown in FIG. 17, there is a difference from the embodiment shown in FIG. 4 in that a heat dissipation pad 305D is connected to the data lines DL rather than the first power voltage lines VDL. In FIG. 17, descriptions overlapping the embodiment shown in FIG. 4 will be omitted.

Referring to FIG. 17, the heat dissipation pad 305D may be connected to conductive lines electrically connected to at least one of the sub-pixels PX, for example, the data lines DL. In such an embodiment, the data lines DL may cross the second power voltage line VSL and the sealant 304 at the upper outer side of the display region DA as shown in FIG. 17. The data lines DL are illustrated in FIG. 17 as being disposed on the second power voltage line VSL, and the sealant 304 is disposed on the data lines DL. Further, the sealant 304 is disposed on the data lines DL, and the heat dissipation pad 305D is disposed on the data lines DL.

When the data lines DL and the heat dissipation pad 305D are formed of the data metal layer DTL, an enlarged plan view of the region D in FIG. 17 is substantially the same as that of FIG. 5. Thus, a detailed description of the enlarged plan view of the region D in FIG. 17 will be omitted.

To prevent or substantially prevent exposure of the data lines DL to the outside, the display panel 300 may further include a data connection electrode, which connects each of the data lines DL and the heat dissipation pad 305D. The data connection electrode may be formed similar to the first power connection electrode VCE shown in FIG. 9. For example, the data connection electrode may be formed of the first gate layer GTL1 like the second power voltage line VSL. In such an embodiment, each of the data lines DL may be connected to the data connection electrode through a contact opening (e.g., a contact hole) passing through the first interlayer insulating film 141 and the second interlayer insulating film 142 to expose the data connection electrode. Further, the heat dissipation pad 305D may be connected to the data connection electrode through a contact opening (e.g., a contact hole) passing through the first interlayer insulating film 141 to expose the data connection electrode. The heat dissipation pad 305D may be completely covered by the insulating heat dissipation adhesive layer 510.

According to the embodiment shown in FIG. 17, because the second power voltage line VSL is formed of the first gate layer GTL1 and the data lines DL and the heat dissipation pad 305 are formed of the data metal layer DTL, the data lines DL may not be short-circuited with the second power voltage line VSL and may be connected to the heat dissipation pad 305. Accordingly, heat of the data lines DL may be dissipated through the heat dissipation pad 305D, the insulating heat dissipation adhesive layer 510, and the heat dissipation sheet 500. Accordingly, the deterioration of the characteristics of the display device 10 or the reduction of the lifespan of the display device 10 due to an increase in internal temperature of the display device 10 may be improved.

Figure 18:
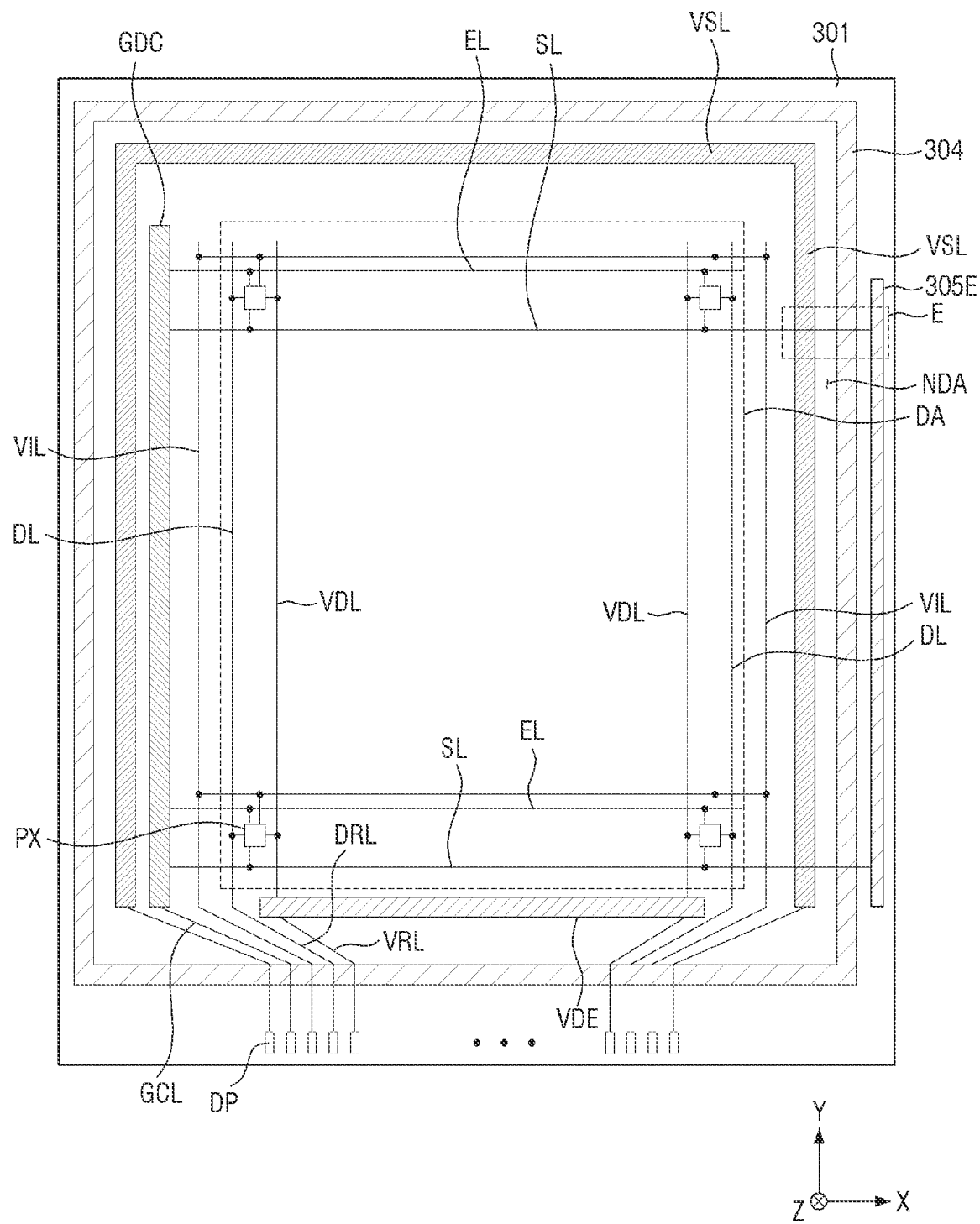
FIG. 18 is a plan view illustrating a display panel according to another embodiment.
Figure 19:
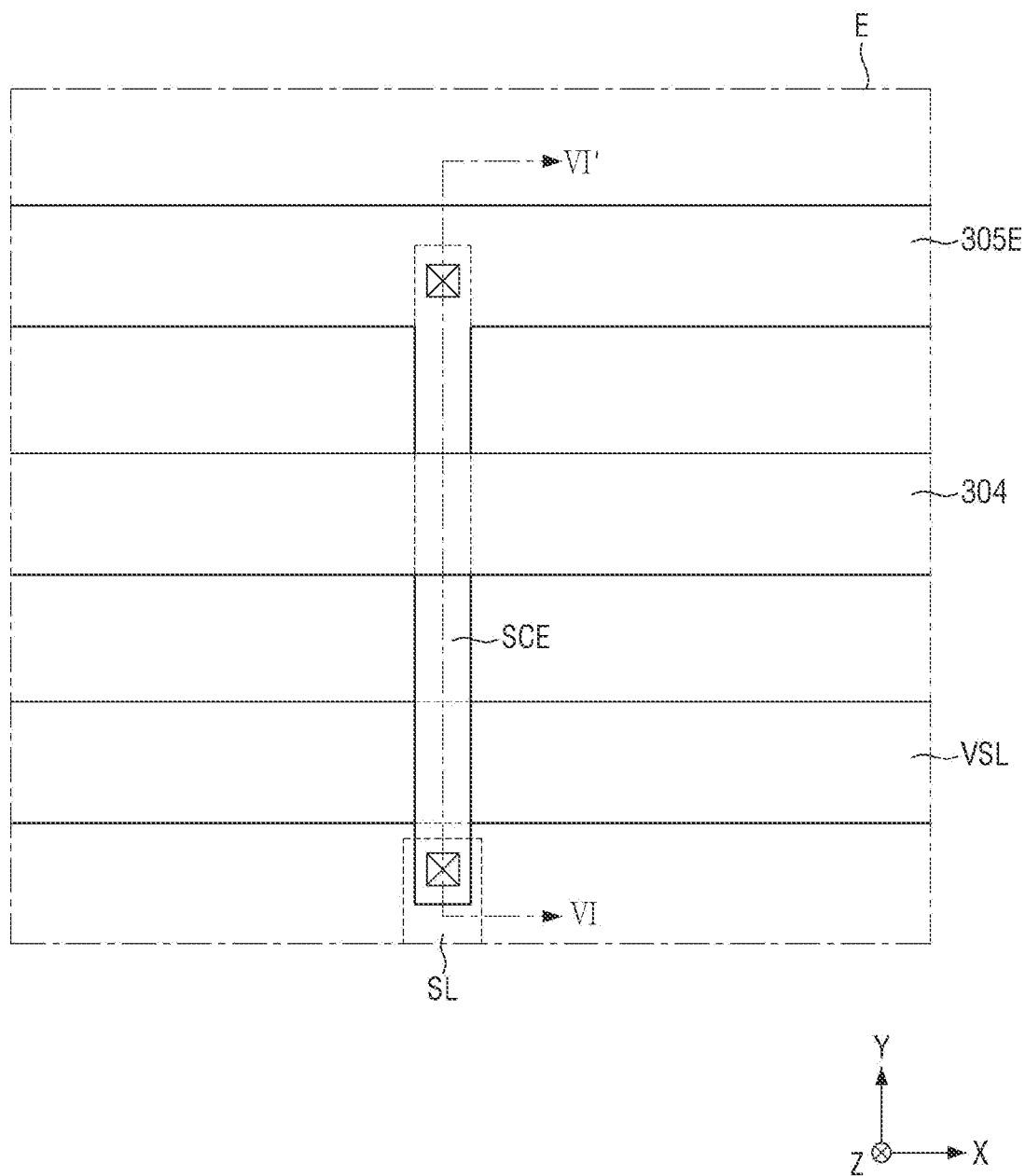
FIG. 19 is an enlarged plan view of the region E in FIG. 18.
Figure 20:
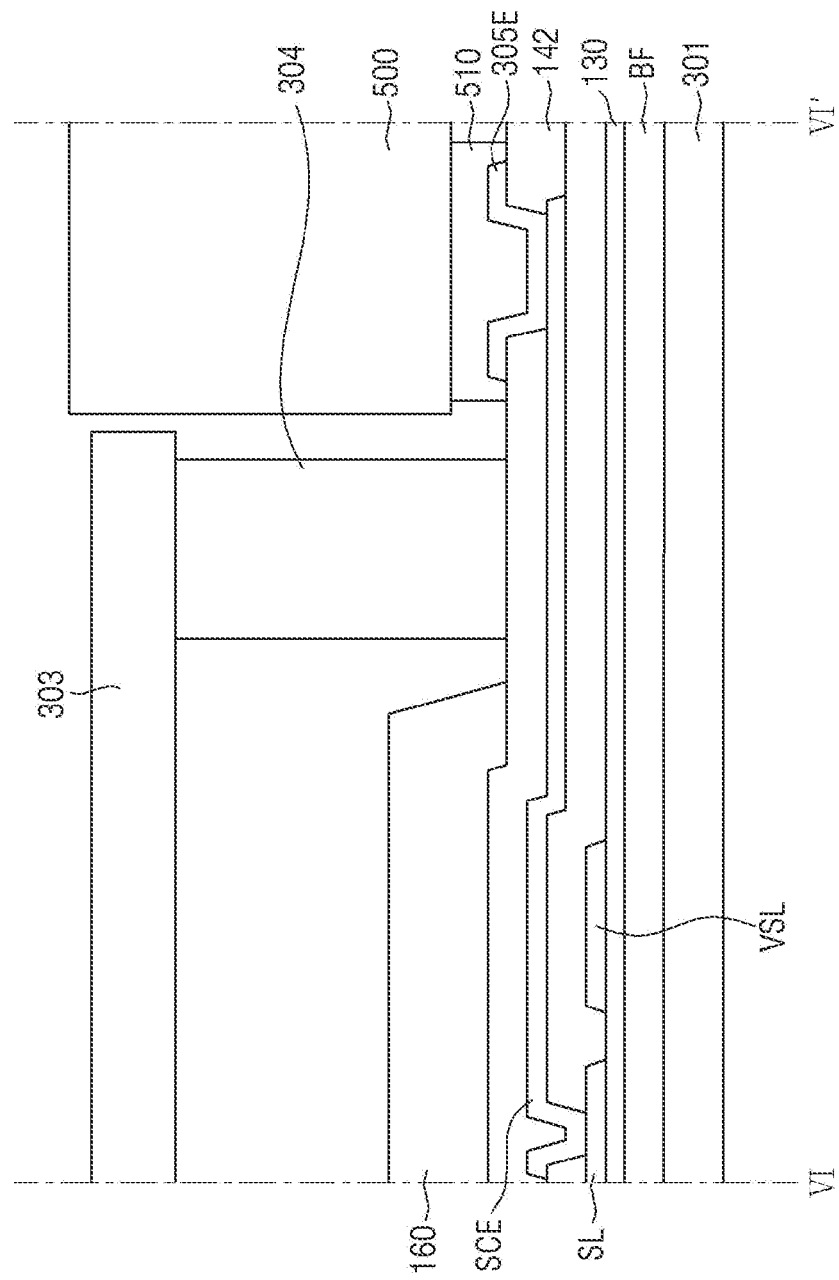
FIG. 20 is a cross-sectional view taken along the line VI-VI' in FIG. 19.

FIG. 18 is a plan view illustrating a display panel according to another embodiment, FIG. 19 is an enlarged plan view of the region E in FIG. 18, and FIG. 20 is a cross-sectional view taken along the line VI-VI' in FIG. 19.

In the embodiment shown in FIGS. 18 to 20, there is a difference from the embodiment shown in FIGS. 4, 5, and 7 in that a heat dissipation pad 305E is disposed at the right side rather than the upper side of the first substrate 301 and is connected to the scan lines SL rather than the first power voltage lines VDL. In FIGS. 18 to 20, descriptions overlapping the embodiment shown in FIGS. 4, 5, and 7 will be omitted.

The heat dissipation pad 305E is disposed in the non-display region NDA and may be disposed at the right side of the first substrate 301. For example, the heat dissipation pad 305E may be disposed at the right outer side of the sealant 304.

The heat dissipation pad 305E may be connected to conductive lines electrically connected to at least one of the sub-pixels PX, for example, the scan lines SL. In such an embodiment, the scan lines SL may cross the second power voltage line VSL and the sealant 304 at the right outer side of the display region DA as shown in FIG. 18. In FIG. 19, because the scan lines SL and the second power voltage line VSL are formed of the first gate layer GTL1, each of the scan lines SL may include a scan connection electrode SCE connected to the heat dissipation pad 305E so that a short-circuit between the scan lines SL and the second power voltage line VSL may be prevented.

The scan connection electrode SCE may be formed of the second gate layer GTL2. In such an embodiment, the scan connection electrode SCE may be connected to the scan lines SL through a thirteenth contact opening (e.g., a thirteenth contact hole) CNT13 passing through the first interlayer insulating film 141 to expose the scan lines SL. Further, the heat dissipation pad 305E may be connected to the scan connection electrode SCE through a fourteenth contact opening (e.g., a fourteenth contact hole) CNT14 passing through the second interlayer insulating film 142 to expose the scan connection electrode SCE. The heat dissipation pad 305E may be completely covered by the insulating heat dissipation adhesive layer 510.

The scan connection electrode SCE may be disposed on the second power voltage line VSL. The second interlayer insulating film 142 may be formed on the scan connection electrode SCE, and the sealant 304 may be formed on the second interlayer insulating film 142. In other embodiments, the second interlayer insulating film 142 and the planarization film 160 may be formed on the scan connection electrode SCE, and the sealant 304 may be formed on the planarization film 160.

According to the embodiment shown in FIGS. 18 to 20, because the scan lines SL and the second power voltage line VSL are formed of the first gate layer GTL1, but each of the scan lines SL includes the scan connection electrode SCE formed of the second gate layer GTL2, the scan connection electrode SCE may not be short-circuited with the second power voltage line VSL and may be connected to the heat dissipation pad 305E. Accordingly, heat of the scan lines SL may be dissipated through the heat dissipation pad 305E, the insulating heat dissipation adhesive layer 510, and the heat dissipation sheet 500. Accordingly, the deterioration of the characteristics of the display device 10 or the reduction of the lifespan of the display device 10 due to an increase in internal temperature of the display device 10 may be improved.

While it is illustrated in FIGS. 18 to 20 that the heat dissipation pad 305E is disposed at the right side of the first substrate 301, the present disclosure is not limited thereto. For example, the heat dissipation pad 305E may be disposed at the left side of the first substrate 301.

Further, FIGS. 18 to 20 illustrate that the heat dissipation pad 305E is connected to the scan lines SL, but the present disclosure is not limited thereto. For example, the heat dissipation pad 305E may be connected to the light emission control lines EL rather than the scan lines SL. In such an embodiment, each of the light emission control lines EL may include a light emission connection electrode formed of the second gate layer GTL2 to prevent a short-circuit with the second power voltage line VSL.

Figure 21:
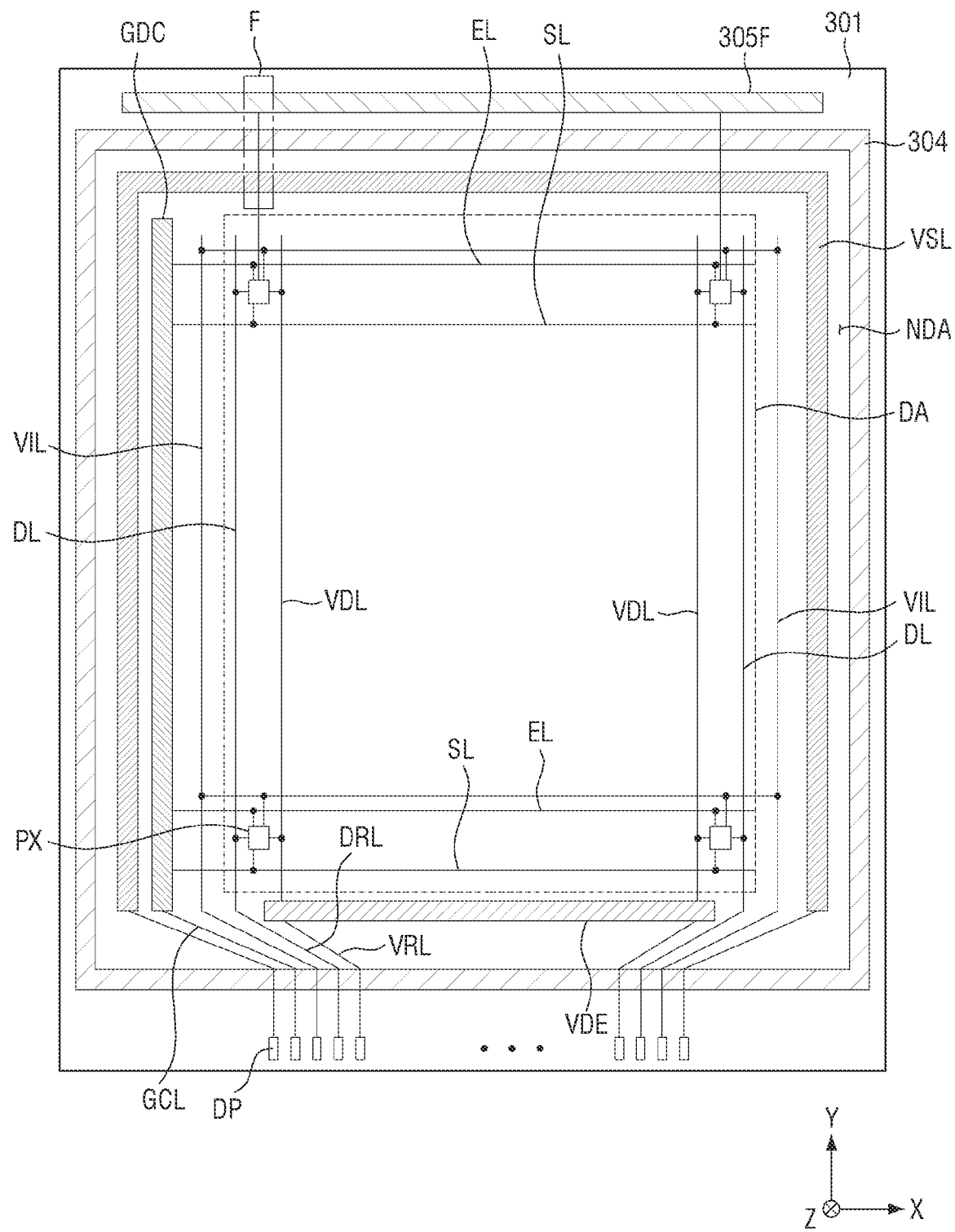
FIG. 21 is a plan view illustrating a display panel according to another embodiment.
Figure 22:
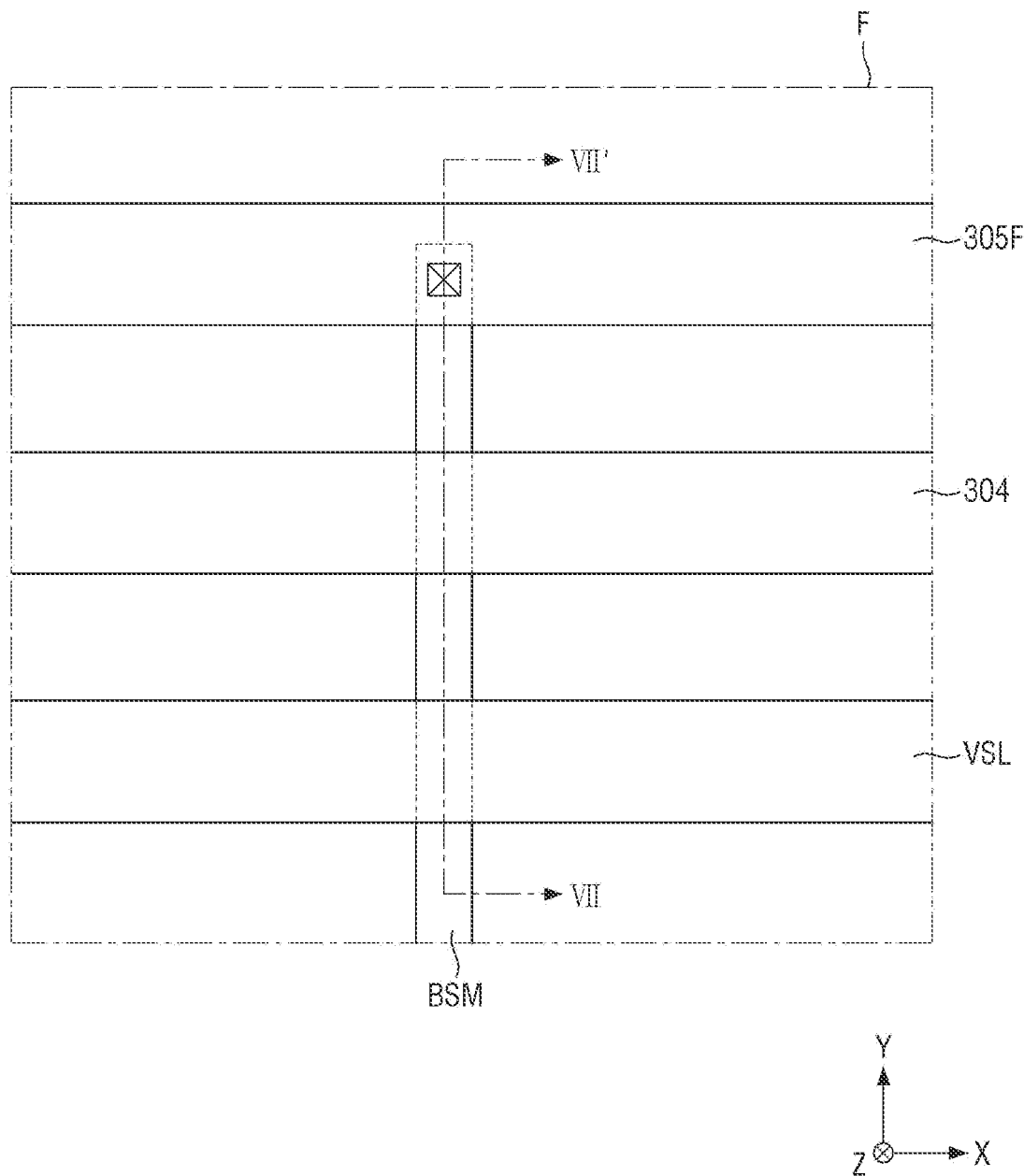
FIG. 22 is an enlarged plan view of the region F in FIG. 21.

FIG. 21 is a plan view illustrating a display panel according to another embodiment, FIG. 22 is an enlarged plan view of the region F in FIG. 21, and FIG. 23 is a cross-sectional view taken along the line VII-VII' in FIG. 22.

In the embodiment shown in FIGS. 21 to 23, there is a difference from the embodiment shown in FIG. 4 in that a heat dissipation pad 305F is connected to the light blocking layers BSM rather than the first power voltage lines VDL. In FIGS. 21 to 23, descriptions overlapping the embodiment shown in FIG. 4 will be omitted.

The heat dissipation pad 305F may be connected to the light blocking layers BSM disposed under conductive lines electrically connected to at least one of the sub-pixels PX, for example, the active layers DT_ACT and ACT1 to ACT6 of the driving transistors DT and the first to sixth switching transistors ST1 to ST6 of the sub-pixels PX. In such an embodiment, the light blocking layers BSM may cross the second power voltage line VSL and the sealant 304 at the upper outer side of the display region DA as shown in FIG. 21. The light blocking layers BSM are illustrated in FIG. 22 as being disposed under the second power voltage line VSL, and the sealant 304 is disposed on the light blocking layers BSM. Further, FIG. 22 illustrates that the heat dissipation pad 305F is disposed on the light blocking layers BSM. In such an embodiment, the heat dissipation pad 305F may be connected to the light blocking layers BSM through fifteenth contact openings (e.g., fifteenth contact holes) CNT15.

As shown in FIG. 23, the second power voltage line VSL is formed of the first gate layer GTL1, and the light blocking layers BSM are formed under the second power voltage line VSL. Accordingly, as shown in FIG. 22, the light blocking layers BSM may be disposed to cross the second power voltage line VSL. Accordingly, the light blocking layers BSM may not be short-circuited with the second power voltage line VSL and may be connected to the heat dissipation pad 305F.

The heat dissipation pad 305F may be connected to the light blocking layers BSM through the fifteenth contact openings CNT15 passing through the buffer film BF, the gate insulating film 130, the first interlayer insulating film 141, and the second interlayer insulating film 142 to expose the light blocking layer BSM. The heat dissipation pad 305F may be completely covered by the insulating heat dissipation adhesive layer 510. Further, the buffer film BF, the gate insulating film 130, the first interlayer insulating film 141, and the second interlayer insulating film 142 may be formed on the light blocking layers BSM, and the sealant 304 may be formed on the second interlayer insulating film 142.

According to the embodiment shown in FIGS. 21 to 23, because the second power voltage line VSL is formed of the first gate layer GTL1, and the light blocking layers BSM are formed under the second power voltage line VSL, the light blocking layers BSM may not be short-circuited with the second power voltage line VSL and may be connected to the heat dissipation pad 305F. Accordingly, heat of the light blocking layers BSM may be dissipated through the heat dissipation pad 305F, the insulating heat dissipation adhesive layer 510, and the heat dissipation sheet 500. Accordingly, the deterioration of the characteristics of the display device 10 or the reduction of the lifespan of the display device 10 due to an increase in internal temperature of the display device 10 may be improved.

Figure 24A:
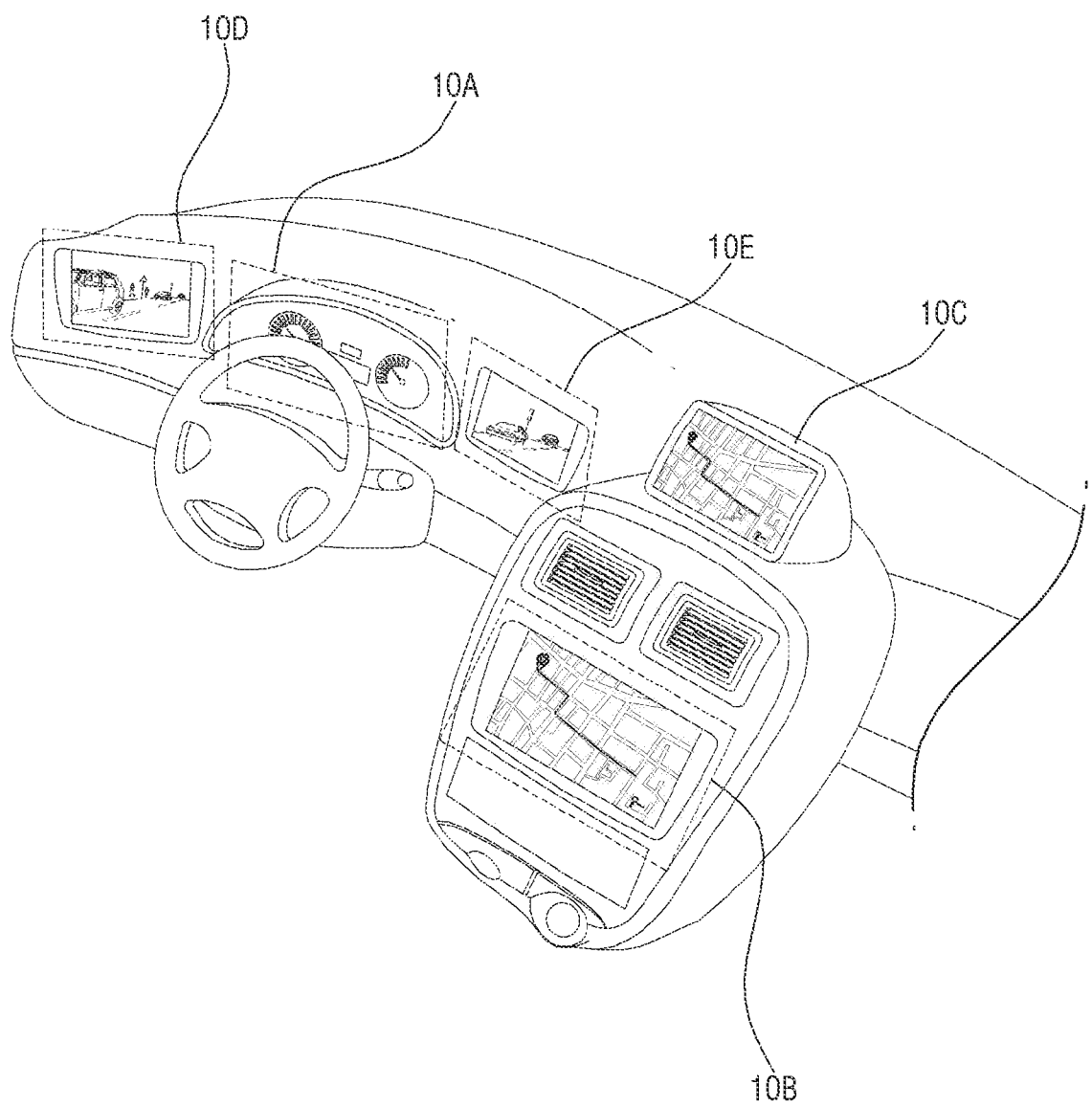
FIGS. 24A and 24B are views illustrating examples in which the display device according to an embodiment is applied to an automobile.
Figure 24B:
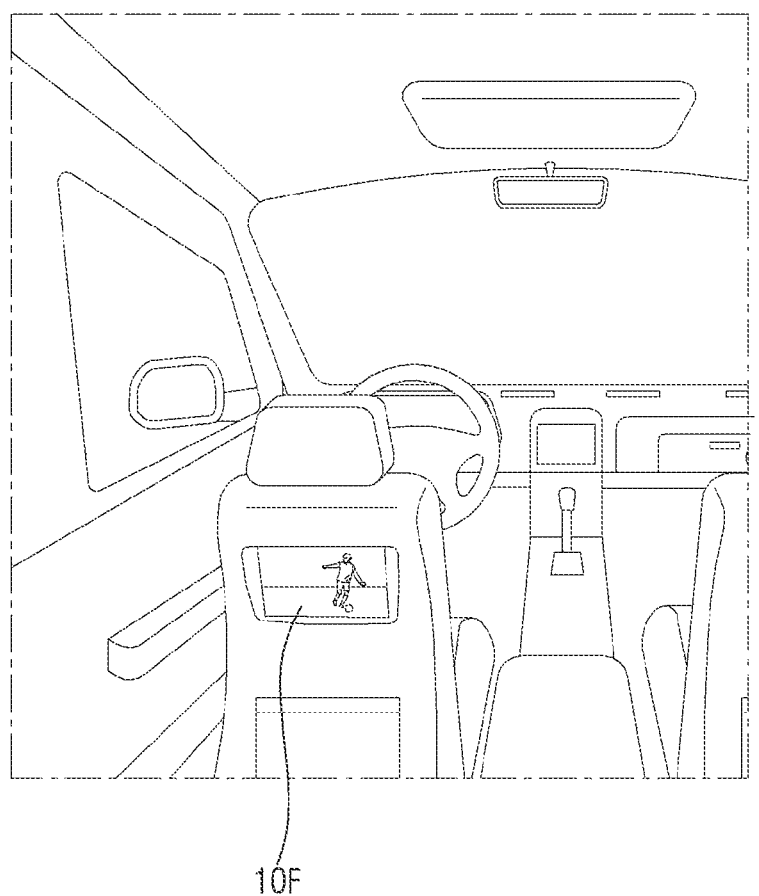

FIGS. 24A and 24B are views illustrating examples in which the display device according to an embodiment is applied to an automobile.

The display device according to an embodiment described with reference to FIGS. 1 to 23 may be applied to an automobile. For example, the display device according to an embodiment may be used as a display device 10A applied to an instrument panel of the automobile, a display device 10B applied to a center fascia of the automobile, and a display device 10C applied to a center information display (CID) disposed on a dashboard of the automobile as shown in FIG. 24A. Further, the display device according to an embodiment may be used as display devices 10D and 10E applied to a room mirror display replacing a side mirror of the automobile as shown in FIG. 24A. In addition, the display device according to one embodiment may be used as entertainment for a rear seat passenger of the automobile, that is, as a display device 10F disposed on a rear surface of a front seat.

Although embodiments of the present disclosure have been described herein with reference to the accompanying drawings, those of ordinary skill in the art to which the present disclosure pertains will understand that they can be implemented in other specific forms without changing the technical spirit of the present disclosure. Therefore, it should be understood that the embodiments described herein are illustrative and non-limiting in all respects.

The invention claimed is:

1. A display device comprising:
a display panel comprising sub-pixels and a heat dissipation pad electrically connected to at least one of the sub-pixels;
a heat dissipation sheet on the heat dissipation pad;
a conductive line configured to electrically connect the at least one of the sub-pixels and the heat dissipation pad; and
an insulating heat dissipation adhesive layer between the heat dissipation sheet and the heat dissipation pad to adhere the heat dissipation sheet and the heat dissipation pad.

2. The display device of claim 1, wherein:
the display panel further comprises a second power voltage line to which a second power voltage is applied; and
the conductive line crosses the second power voltage line.

3. The display device of claim 2, wherein:
the display panel further comprises a sealant extending around a display region where the sub-pixels are disposed; and
the conductive line crosses the sealant.

4. The display device of claim 3, wherein:
the sealant is at an outer side of the second power voltage line; and
the heat dissipation pad is at an outer side of the sealant.

5. The display device of claim 2, wherein each of the sub-pixels comprises a light emitting element and a driving transistor,
wherein the driving transistor is configured to control currents flowing from a first power line, to which a first power voltage higher than the second power voltage is applied, to the light emitting element according to a data voltage applied to a gate electrode thereof.

6. The display device of claim 5, wherein:
the first power voltage is applied to the conductive line; and
the conductive line is on the second power voltage line.

7. The display device of claim 5, wherein each of the sub-pixels further comprises an initialization transistor configured to initialize the gate electrode of the driving transistor to an initialization voltage.

8. The display device of claim 7, wherein:
the initialization voltage is applied to the conductive line; and
the conductive line is on the second power voltage line.

9. The display device of claim 5, wherein each of the sub-pixels further comprises a scan transistor configured to supply the data voltage to the gate electrode of the driving transistor according to a scan signal.

10. The display device of claim 9, wherein:
the data voltage is applied to the conductive line; and
the conductive line is on the second power voltage line.

11. The display device of claim 9, wherein:
the scan signal is applied to the conductive line; and
the conductive line is on the same layer as the second power voltage line.

12. The display device of claim 11, wherein the conductive line comprises a scan connection electrode on the second power voltage line.

13. The display device of claim 5, wherein each of the sub-pixels further comprises a light emission control transistor configured to block currents flowing from the first power line to the light emitting element through the driving transistor according to a light emission control signal.

14. The display device of claim 13, wherein:
the light emission control signal is applied to the conductive line; and
the conductive line is on the same layer as the second power voltage line.

15. The display device of claim 5, wherein:
each of the sub-pixels further comprises a light blocking layer under an active layer of the driving transistor; and
the conductive line is connected to the light blocking layer.

16. The display device of claim 15, wherein the conductive line is under the second power voltage line.

17. The display device of claim 1, wherein:
the display panel further comprises a second power voltage line to which a second power voltage is applied; and
the conductive line is connected to the second power voltage line.

18. The display device of claim 1, wherein:
the display panel comprises a first substrate and a second substrate on the first substrate; and
the heat dissipation pad is at one side of the first substrate that is not covered by the second substrate.

19. The display device of claim 18, wherein the heat dissipation sheet is on a portion of an upper surface, one side surface, and a portion of a lower surface of the first substrate.

20. The display device of claim 18, wherein the display panel further comprises display pads at another side of the first substrate that is not covered by the second substrate.

21. The display device of claim 20, further comprising a flexible circuit board attached to the display pads of the display panel.

22. The display device of claim 1, wherein the insulating heat dissipation adhesive layer is a thermally conductive silicon adhesive.

* * * * *